United States Patent
Nguyen et al.

(10) Patent No.: US 11,393,516 B2
(45) Date of Patent: Jul. 19, 2022

(54) SOT-BASED SPIN TORQUE OSCILLATORS FOR OSCILLATORY NEURAL NETWORKS

(71) Applicant: Western Digital Technologies, Inc., San Jose, CA (US)

(72) Inventors: Thao A. Nguyen, San Jose, CA (US); Michael Ho, Redwood City, CA (US); Xiaoyong Liu, San Jose, CA (US); Zhigang Bai, Fremont, CA (US); Zhanjie Li, Pleasanton, CA (US); Quang Le, San Jose, CA (US); Yongchul Ahn, San Jose, CA (US); Hongquan Jiang, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/172,175

(22) Filed: Feb. 10, 2021

(65) Prior Publication Data
US 2022/0122647 A1    Apr. 21, 2022

Related U.S. Application Data

(60) Provisional application No. 63/093,522, filed on Oct. 19, 2020.

(51) Int. Cl.
*G11C 11/16*    (2006.01)
*G06N 3/063*    (2006.01)

(52) U.S. Cl.
CPC .......... *G11C 11/1675* (2013.01); *G06N 3/063* (2013.01); *G11C 11/1655* (2013.01); *G11C 11/1657* (2013.01); *G11C 11/1673* (2013.01)

(58) Field of Classification Search
CPC . G06N 3/063; G11C 11/1675; G11C 11/1655; G11C 11/1657; G11C 11/1673
See application file for complete search history.

(56) References Cited

U.S. PATENT DOCUMENTS 10,340,901 B2   7/2019   Yoshinari et al.
10,528,643 B1   1/2020   Choi et al.
(Continued)

FOREIGN PATENT DOCUMENTS

JP    6620915    12/2019

OTHER PUBLICATIONS

Fan et al., "Energy Efficient In-Memory Binary Deep Neural Network Accelerator with Dual-Mode SOT-MRAM", 2017 IEEE International Conference on Computer Design (ICCD), Nov. 5-8, 2017 https://ieeexplore.ieee.org/document/8119280.

(Continued)

*Primary Examiner* — Ajay Ojha
(74) *Attorney, Agent, or Firm* — Vierra Magen Marcus LLP

(57) ABSTRACT

An apparatus is provided that includes an array including m rows and n columns of nodes. Each column of nodes is coupled to one of n first conductive lines, and each row of nodes is coupled to one of m second conductive lines. Each node of the m rows and n columns of nodes includes a spin orbit torque-based spin torque oscillator circuit configured to oscillate at a corresponding intrinsic frequency. The spin orbit torque-based spin torque oscillator circuits are configured to generate m output signals at the m second conductive lines upon application of n input signals to corresponding n first conductive lines. The n input signals correspond to an n-element input vector, and each input signal includes a corresponding input signal frequency. Each of the m output signals include frequency domain components at the input signal frequencies. The magnitudes of the frequency domain components at the input signal frequencies depend on a degree of synchronization between the input signal frequencies and the intrinsic frequencies.

20 Claims, 11 Drawing Sheets

(56) References Cited

U.S. PATENT DOCUMENTS

| | | | |
|---|---|---|---|
| 10,832,710 | B1 | 11/2020 | Song et al. |
| 11,177,432 | B2 * | 11/2021 | Chen .................. G06N 3/0635 |
| 2007/0077454 | A1 | 4/2007 | Sakamoto et al. |
| 2014/0056061 | A1 | 2/2014 | Khvalkovskiy et al. |
| 2014/0176184 | A1 | 6/2014 | Johnson |
| 2014/0269035 | A1 * | 9/2014 | Manipatruni ......... G11C 11/161 365/158 |
| 2015/0213868 | A1 | 7/2015 | Wu et al. |
| 2016/0300999 | A1 | 10/2016 | Yi et al. |
| 2016/0372656 | A1 | 12/2016 | Pinarbasi et al. |
| 2017/0178705 | A1 | 6/2017 | Buhrman et al. |
| 2017/0330070 | A1 | 11/2017 | Sengupta et al. |
| 2018/0033954 | A1 | 2/2018 | Aradhya et al. |
| 2018/0061467 | A1 | 3/2018 | Kan et al. |
| 2019/0131977 | A1 | 5/2019 | Obradovic et al. |
| 2019/0265074 | A1 | 8/2019 | Gaydov et al. |
| 2019/0272870 | A1 | 9/2019 | Choi et al. |
| 2020/0012924 | A1 | 1/2020 | Ma et al. |
| 2020/0034686 | A1 | 1/2020 | Chiu et al. |
| 2020/0035910 | A1 | 1/2020 | Li et al. |
| 2020/0058847 | A1 | 2/2020 | Lee et al. |
| 2020/0075099 | A1 | 3/2020 | Choi et al. |
| 2020/0168790 | A1 | 5/2020 | Oikawa et al. |
| 2020/0312908 | A1 | 10/2020 | Oguz et al. |
| 2021/0064379 | A1 * | 3/2021 | Mattina .................. G06F 17/16 |
| 2021/0202827 | A1 | 7/2021 | Song et al. |

OTHER PUBLICATIONS

Ohno et al., "Spin-orbit Torque Devices for Digital and Neuromorphic Computing", Sep. 28, 2017 http://csrn-osaka.sakura.ne.jp/kanamori-memorial/abstract-session-Spintronics/S4-Ohno.pdf.

Milo et al., "Memristive and CMOS Devices for Neuromorphic Computing", Dipartimento di Elletronica, Informazione e Biongengneria, Politecnico di Milano and Italian Universities Nanoelectronics Team (IU.NET), Jan. 1, 2020 https://www.mdpi.com/1996-1944/13/1/166/htm.

Torrejon et al., "Neuromorphic computing with nanoscale spintronic oscillators", nature.com, Jul. 27, 2017, https://arxiv.org/ftp/arxiv/papers/1701/1701.07715.pdf.

Andrew Myers, "Small, fast, energy-efficient memory to spur new computer applications", engineering.stanford.edu, Nov. 6, 2018, https://engineering.stanford.edu/magazine/article/small-fast-energy-efficient-memory-spur-new-computer-applications.

Deliang Fan et al., "Injection-Locked Spin Hall-Induced Coupled-Oscillators for Energy Efficient Associative Computing", IEEE Transactions on Nanotechnology, vol. 14, No. 6, Nov. 2015.

U.S. Appl. No. 17/172,155, filed Feb. 10, 2021.

U.S. Appl. No. 17/172,190, filed Feb. 10, 2021.

Notice of Allowance and Fee(s) Due dated Jan. 10, 2022 in U.S. Appl. No. 17/172,190.

* cited by examiner

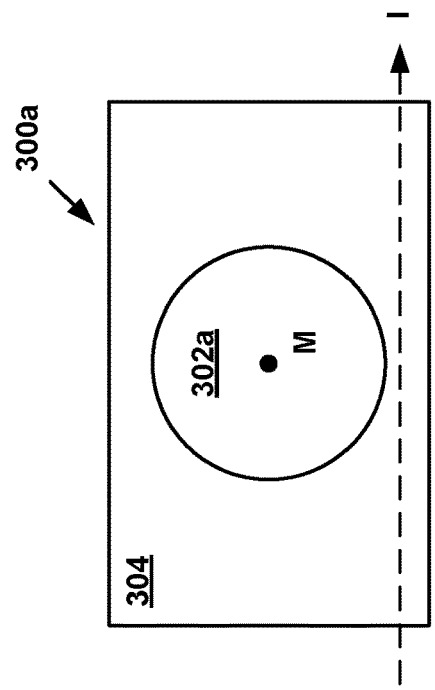
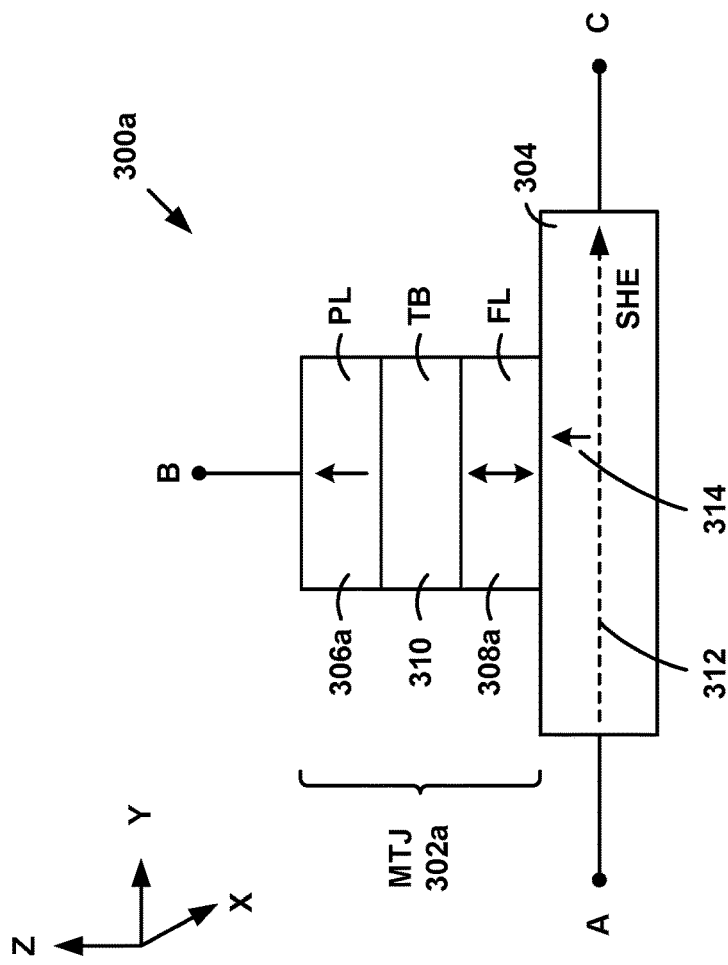
FIG. 3A2
FIG. 3A1

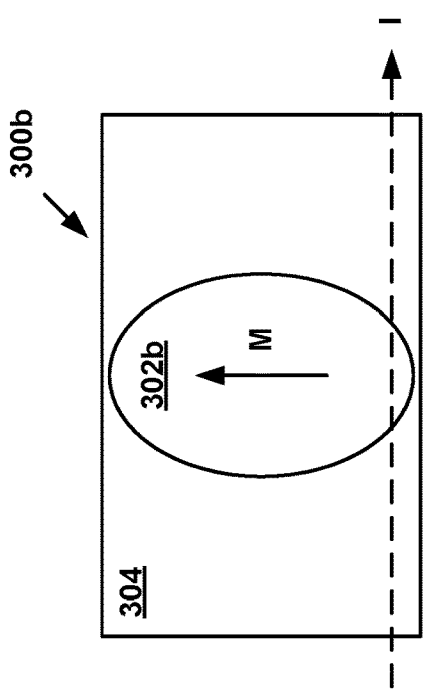
FIG. 3B2
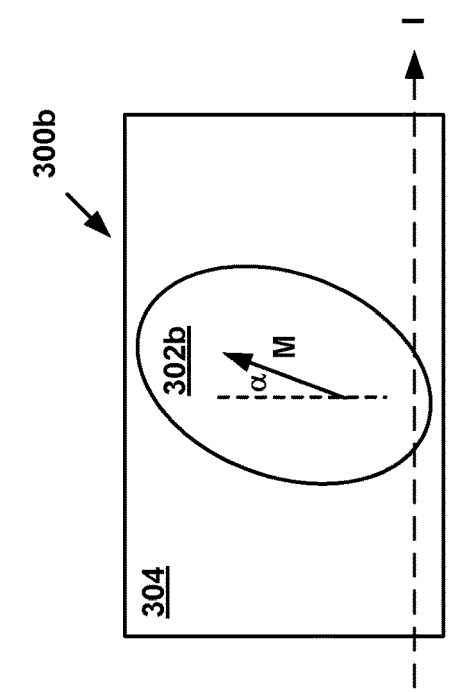
FIG. 3B3
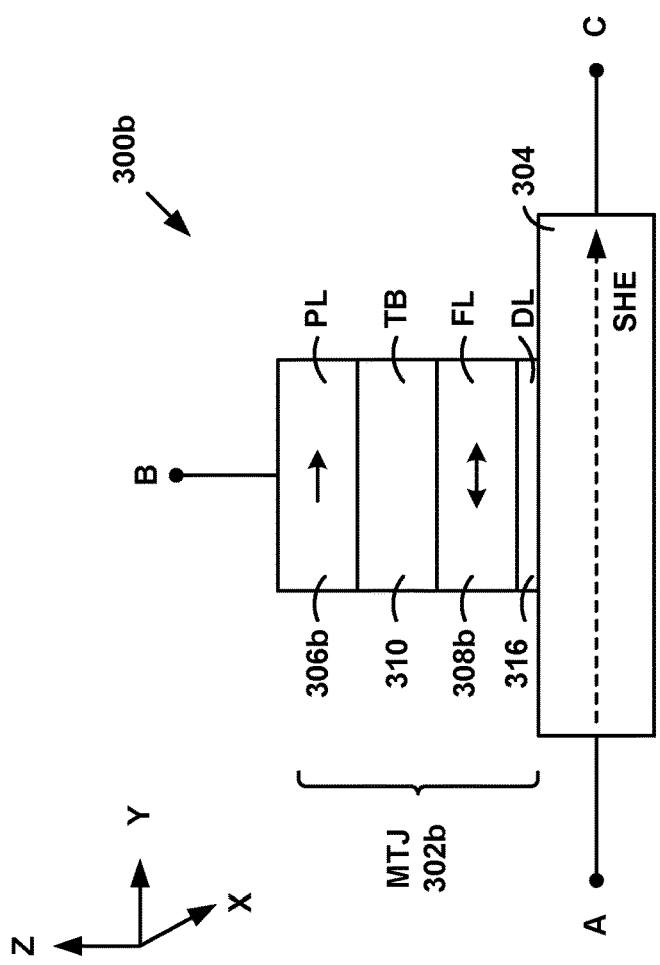
FIG. 3B1

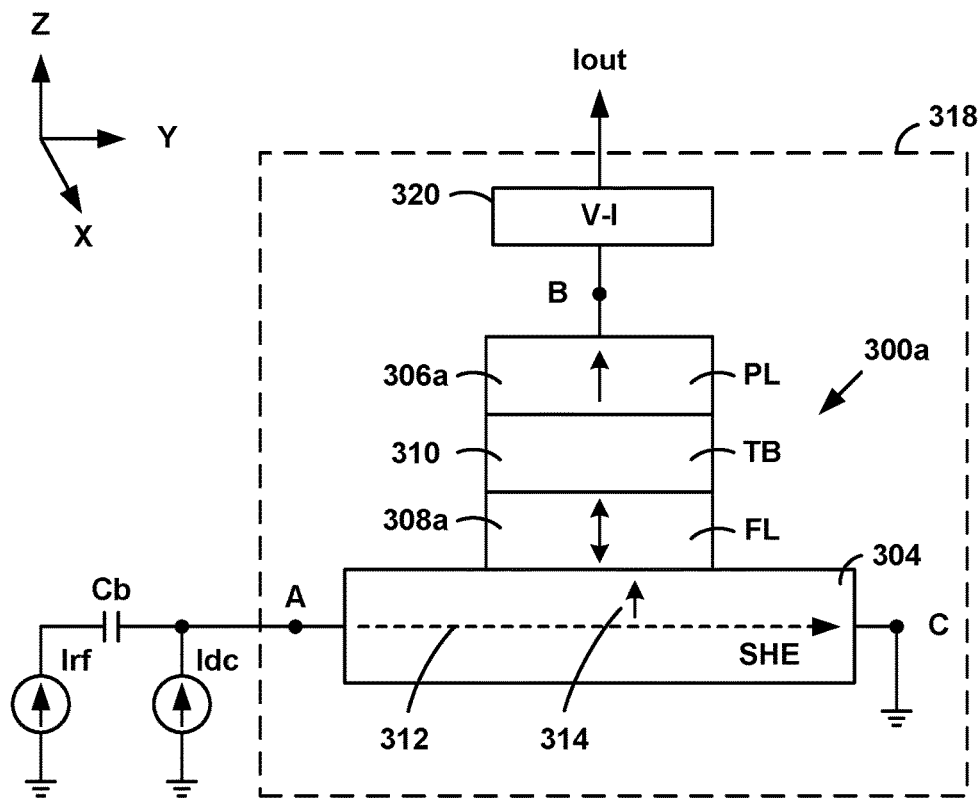
FIG. 3C1
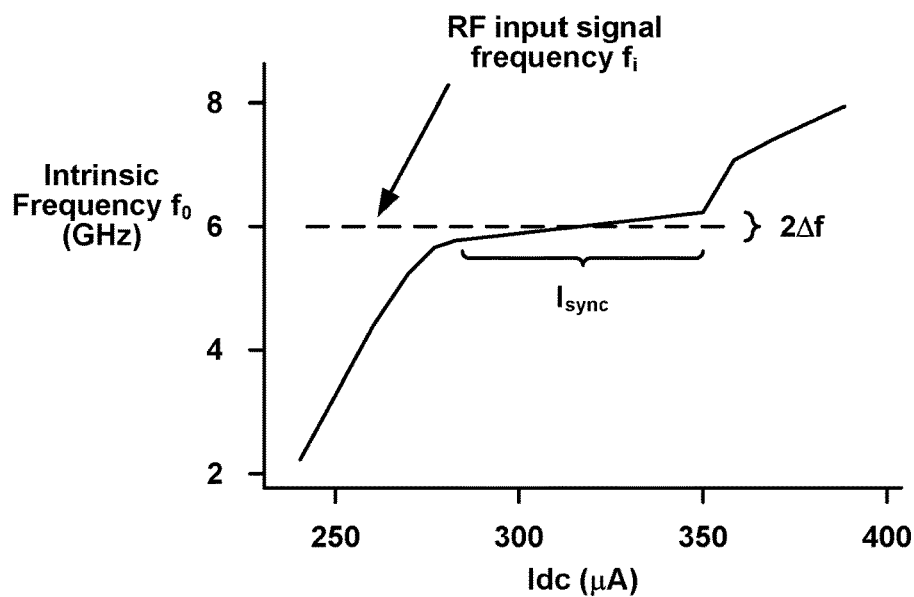
FIG. 3C2

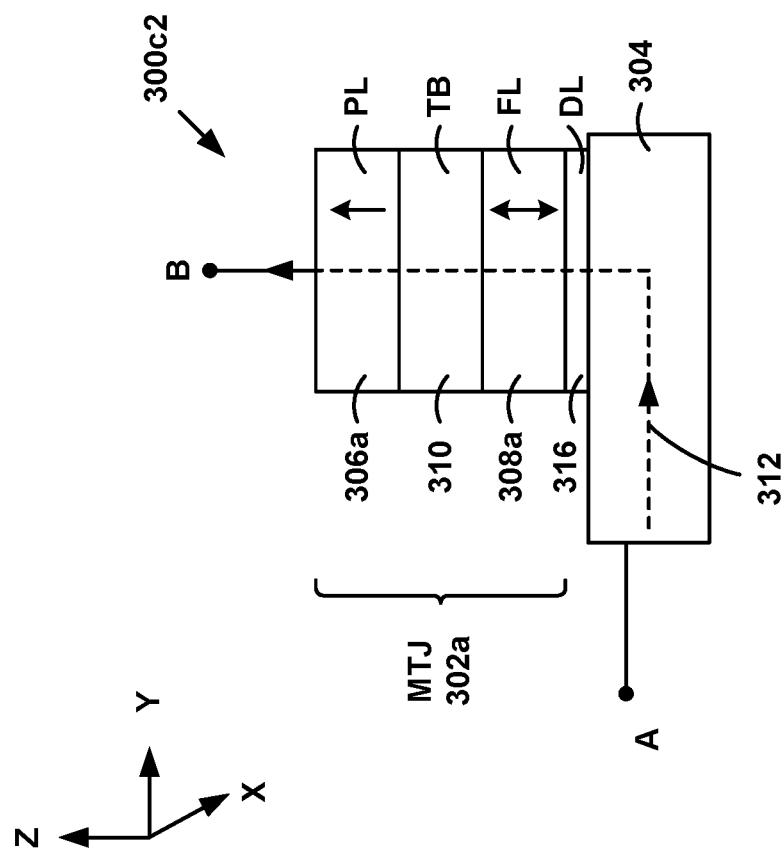
FIG. 3D2
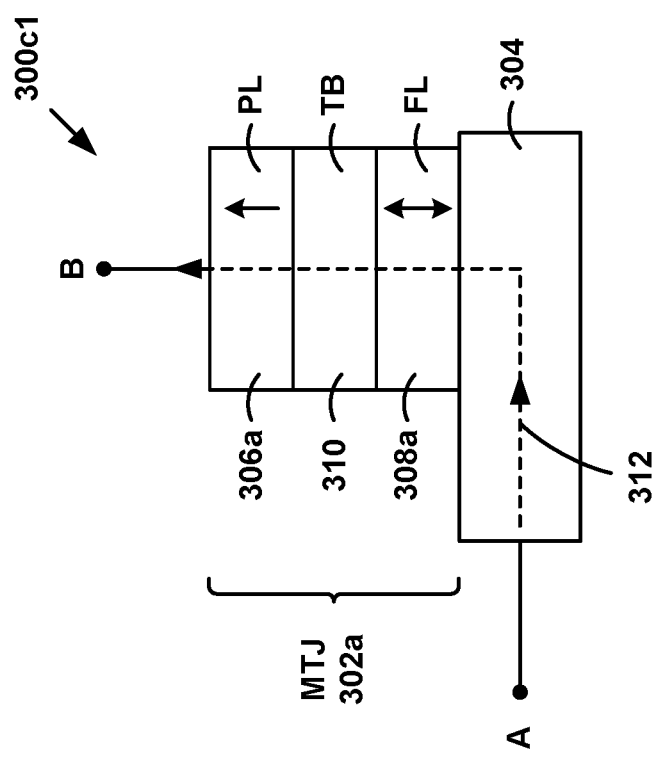
FIG. 3D1

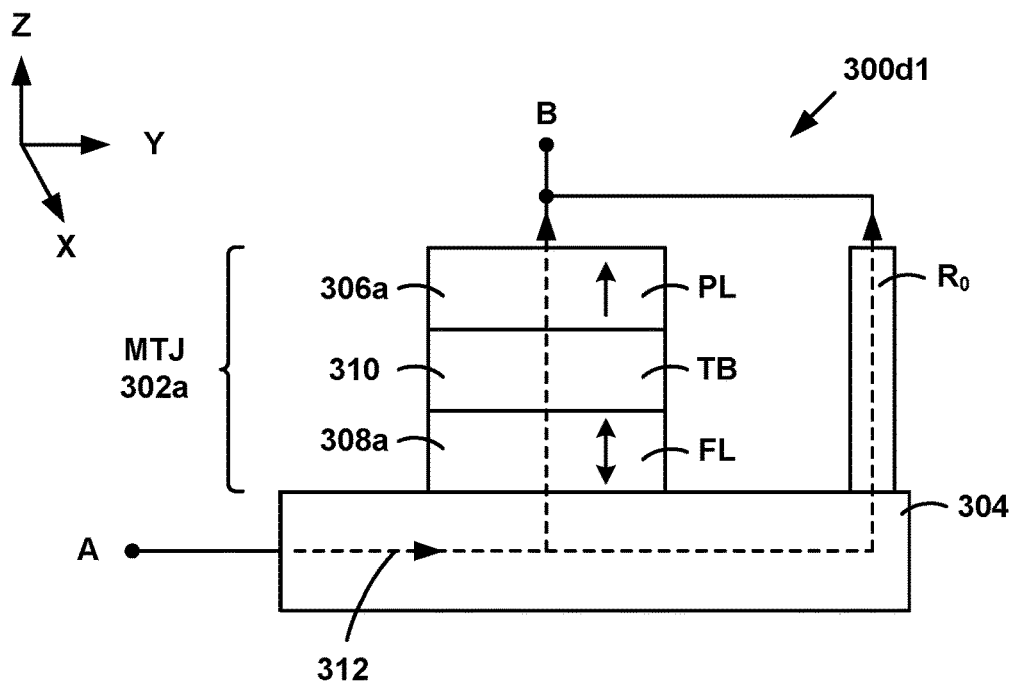
FIG. 3E1
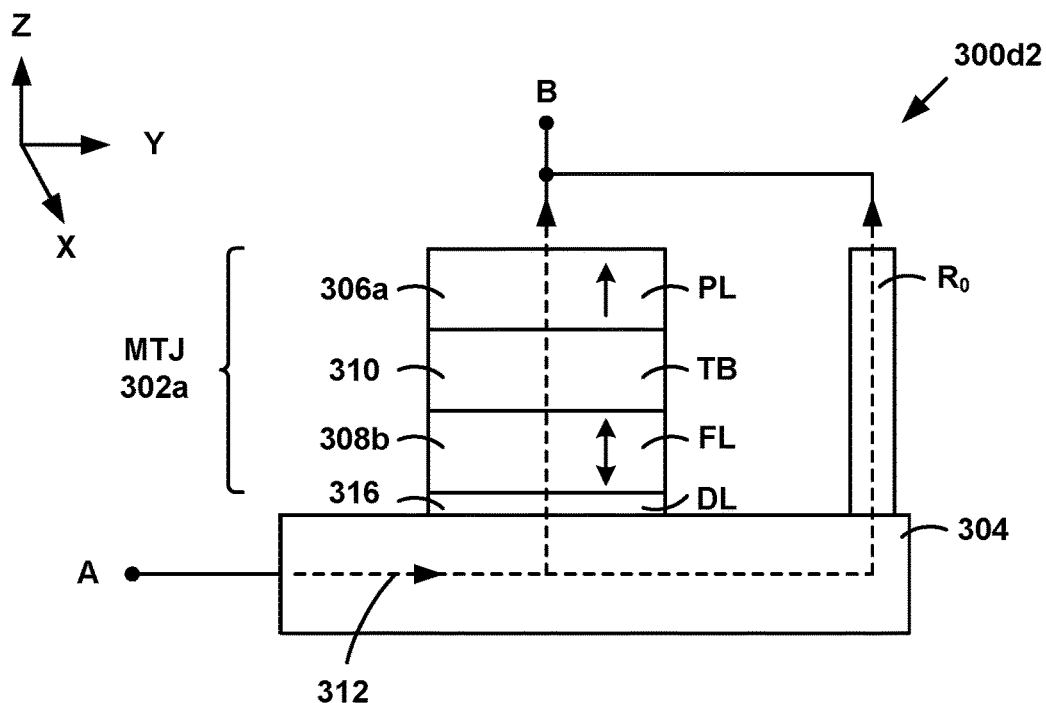
FIG. 3E2

SOT-BASED SPIN TORQUE OSCILLATORS FOR OSCILLATORY NEURAL NETWORKS

CLAIM OF PRIORITY

The present application claims priority from U.S. Provisional Patent Application No. 63/093,522, entitled "SOT-BASED SPIN TORQUE OSCILLATORS FOR OSCILLATORY NEURAL NETWORKS," filed Oct. 19, 2020, incorporated by reference herein in its entirety.

BACKGROUND

Artificial neural networks that include large numbers of nanoscale oscillators, commonly referred to as oscillatory neural networks, seek to mimic the processing methods of the brain to perform neuromorphic computing. Several challenges exist to practical implementations of such oscillatory neural networks.

BRIEF DESCRIPTION OF THE DRAWINGS

FIGS. 3A1-3A2 depict various views of a spin an SOT-based STO that may be included in the oscillator circuits of the cross-point array of FIG. 2A.

FIGS. 3B1-3B3 depict various views of another SOT-based STO that may be included in the oscillator circuits of the cross-point array of FIG. 2A.

FIG. 3C1 is a diagram of an embodiment of an oscillator circuit that may be used in the cross-point array of FIG. 2A.

FIG. 3C2 depicts an example diagram of intrinsic frequency versus DC input current for the oscillator circuit of FIG. 3C1.

FIG. 3D1 depicts a view of another SOT-based STO that may be included in the oscillator circuits of the cross-point array of FIG. 2A.

FIG. 3D2 depicts a view of still another SOT-based STO that may be included in the oscillator circuits of the cross-point array of FIG. 2A.

FIG. 3E1 depicts a view of yet another SOT-based STO that may be included in the oscillator circuits of the cross-point array of FIG. 2A.

FIG. 3E2 depicts a view of another SOT-based STO that may be included in the oscillator circuits of the cross-point array of FIG. 2A.

DETAILED DESCRIPTION

Technology is described for implementing oscillatory neural networks using spin orbit torque (SOT)-based spin torque oscillator (STO) circuits, referred to herein as SOT-based STO circuits. In embodiments, each SOT-based STO circuit includes a spin Hall effect layer that generates a spin current in response to an input electrical current. The spin current provides a spin orbit torque that causes a magnetization direction of a magnetic layer adjacent to it to oscillate at an oscillation frequency.

In embodiments, in response to input signals that each include an input signal frequency, the oscillation frequency of each SOT-based STO may synchronize to an input signal frequency if the oscillation frequency is close to the input signal frequency. In embodiments, each SOT-based STO circuit generates an output signal that includes frequency domain components at the input signal frequencies. In embodiments, the magnitudes of the frequency domain components at the input signal frequencies depend on a degree of synchronization between the input signal frequencies and the oscillation frequencies.

Figure 1B:
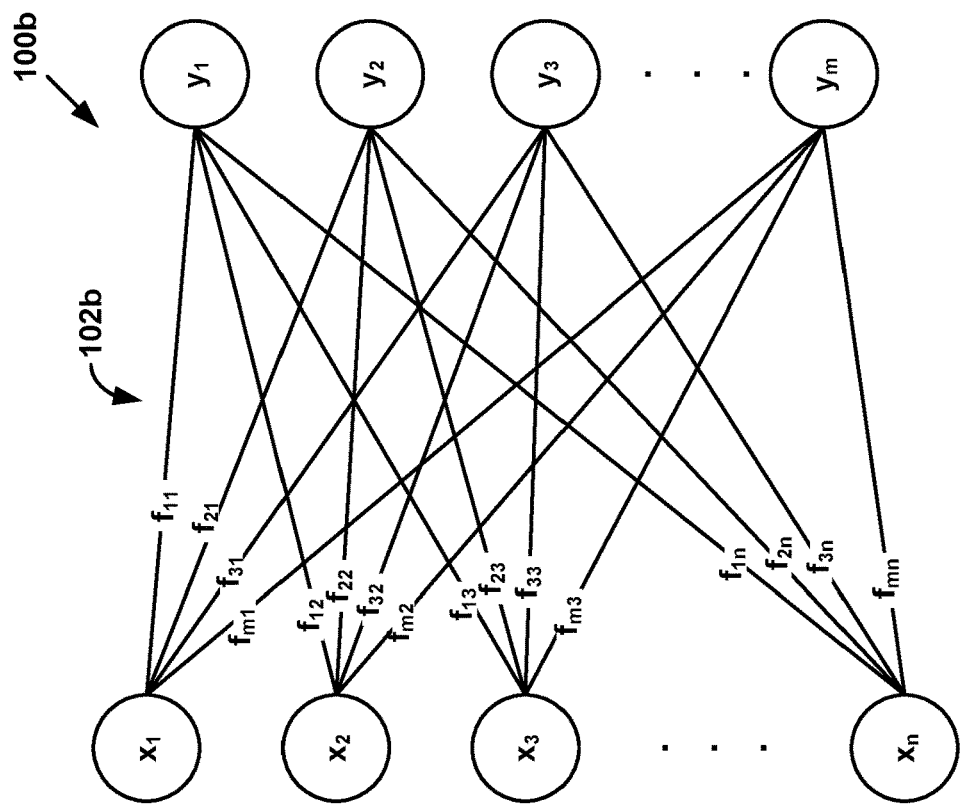
FIG. 1B is a diagram of another example artificial neural network.
Figure 1A:
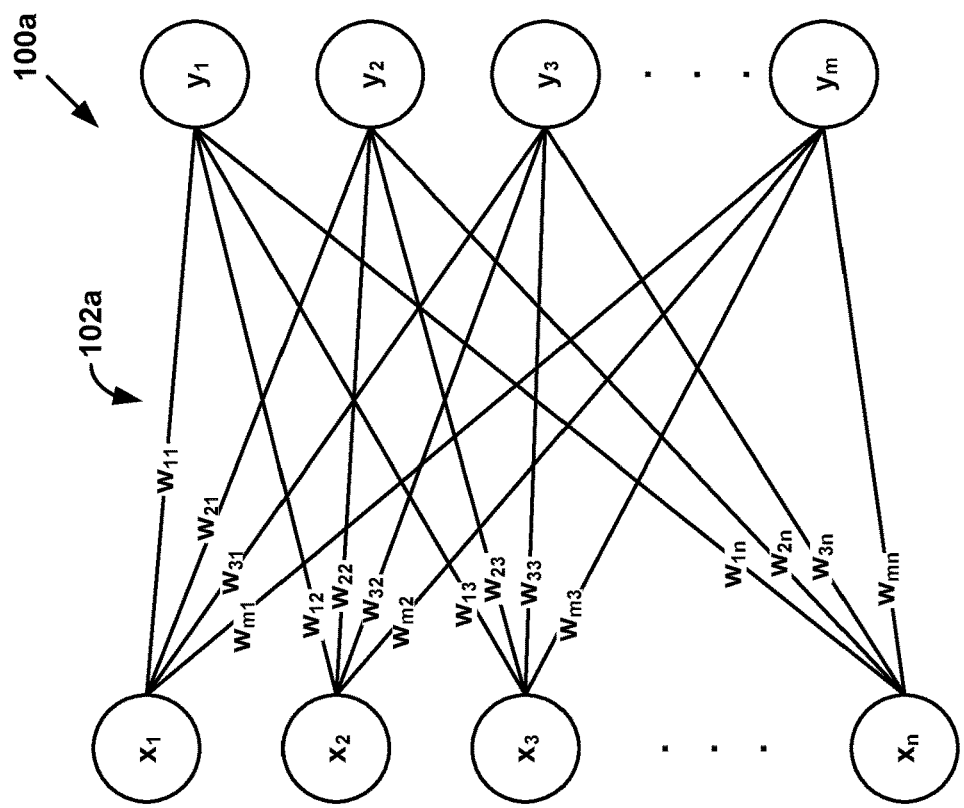
FIG. 1A is a diagram of an example artificial neural network.

FIG. 1A depicts an example of an artificial neural network $100a$ that includes input neurons $x_1, x_2, x_3, \ldots, x_n$, output neurons $y_1, y_2, y_3, \ldots, y_m$, and synapses $102a$ that connect input neurons $x_1, x_2, x_3, \ldots, x_n$ to output neurons $y_1, y_2, y_3, \ldots, y_m$. In an embodiment, each synapse $102a$ has a corresponding scalar weight $w_{11}, w_{12}, w_{13}, \ldots, w_{nm}$. In some artificial neural networks, each output neuron $y_1, y_2, y_3, \ldots, y_m$ (before a non-linear function is applied) has a value equal to a sum of products of input neurons $x_1, x_2, x_3, \ldots, x_n$ multiplied by corresponding scalar weights $w_{11}, w_{12}, w_{13}, \ldots, w_{nm}$.

In other artificial neural networks, sometimes referred to as oscillatory neural networks, input neurons $x_1, x_2, x_3, \ldots, x_n$ and output neurons $y_1, y_2, y_3, \ldots, y_m$ are coupled via oscillator circuits. FIG. 1B depicts an example of such an oscillatory neural network $100b$. In an embodiment, each synapse $102b$ includes an oscillator circuit that oscillates at a corresponding oscillation frequency $f_{11}, f_{12}, f_{13}, \ldots, f_{nm}$. In such an embodiment, weights $w_{11}, w_{12}, w_{13}, \ldots, w_{nm}$ (not depicted to avoid overcrowding the drawing) are used to tune the oscillator circuits to their corresponding oscillation frequencies $f_{11}, f_{12}, f_{13}, \ldots, f_{nm}$, respectively.

In an embodiment, each of input neurons $x_1, x_2, x_3, \ldots, x_n$ includes an input signal having one or more input signal frequencies, and each of output neurons $y_1, y_2, y_3, \ldots, y_m$ includes an output signal that includes frequency domain components at the input signal frequencies. In an embodiment, the magnitudes of the frequency domain components at the input signal frequencies depend on a degree of synchronization between the input signal frequencies and the oscillation frequencies.

For example, if an input neuron $x_1$ that includes an input signal having an input signal frequency $f_i$ is coupled to an output neuron $y_1$ via an oscillator circuit having an oscillation frequency $f_{11}$, output neuron $y_1$ includes an output signal that includes a frequency domain component at input signal frequency $f_i$. The magnitude of the frequency domain component at input signal frequency $f_i$ is based on a degree of synchronization between input signal frequency $f_i$ and oscillation frequency $f_{11}$.

In an embodiment, the closer input signal frequency $f_i$ is to oscillation frequency $f_{11}$, the greater the degree of synchronization between input signal frequency $f_i$ and oscillation frequency $f_{11}$, and the greater the magnitude of the frequency domain component at input signal frequency $f_i$ in the output signal.

In the more general case, input neuron $x_1$ includes an input signal having multiple input signal frequencies $f_{i1}, f_{i2}, f_{i3}, \ldots$. Input neuron $x_1$ is coupled to each of output neurons $y_1, y_2, y_3, \ldots, y_m$ via oscillator circuits tuned to oscillation frequencies $f_{11}, f_{21}, f_{31}, \ldots, f_{m1}$, respectively. The amount of "information" communicated between input neuron $x_1$ and each of output neurons $y_1, y_2, y_3, \ldots, y_m$ depends on how closely input signal frequencies $f_{i1}, f_{i2}, f_{i3}, \ldots$ match oscillation frequencies $f_{11}, f_{21}, f_{31}, \ldots, f_{m1}$, respectively.

The closer the match between an input signal frequency and an oscillation frequency of a particular oscillator circuit, the greater the amount of information communicated from input neuron $x_1$ to the output neuron coupled via that oscillator circuit. Conversely, the farther the match between an input signal frequency and an oscillation frequency of a particular oscillator circuit, the lesser the amount of information communicated from input neuron $x_1$ to the output neuron coupled via that oscillator circuit.

Figure 2A:
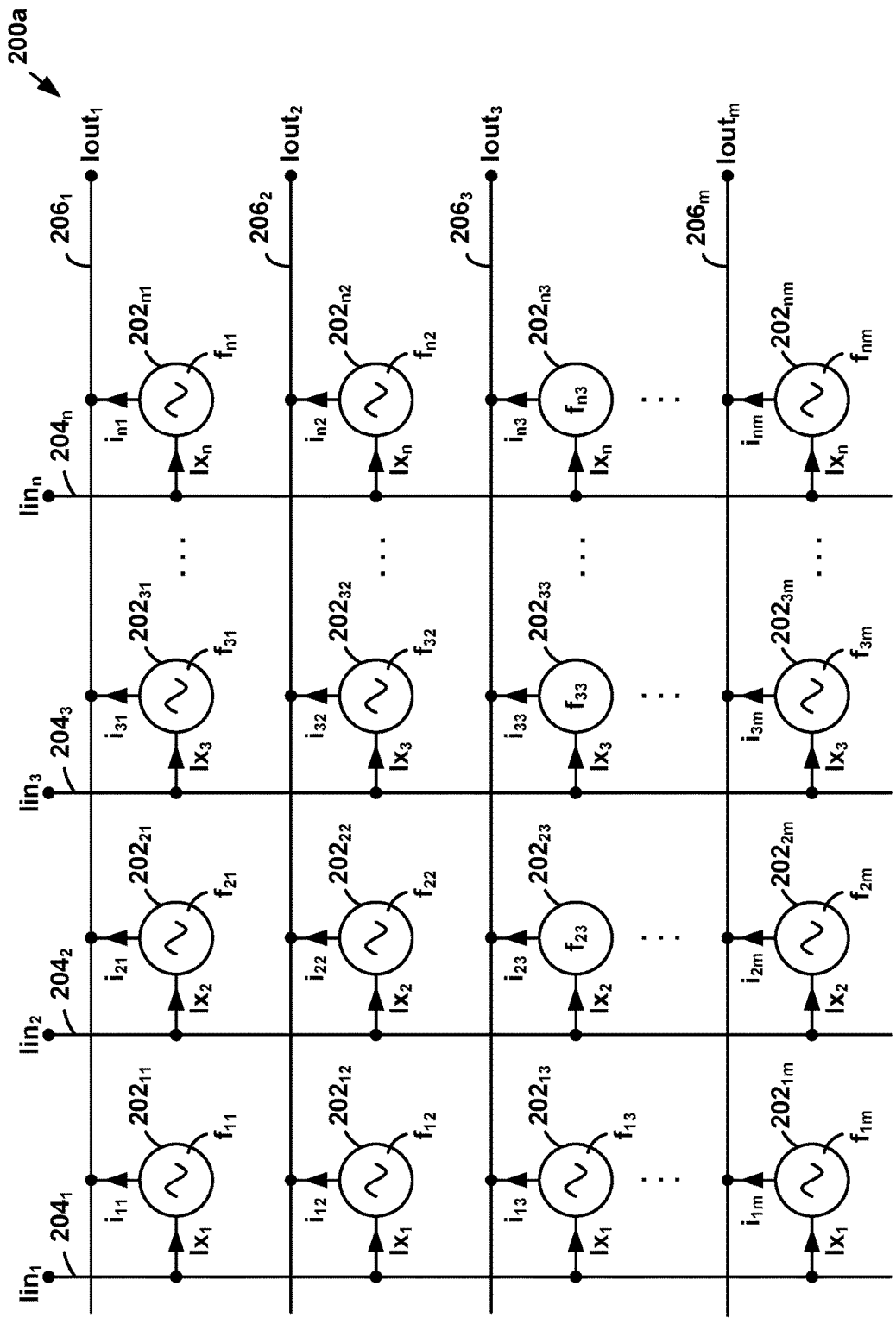
FIG. 2A depicts an example cross-point array that may be used to implement the artificial neural network of FIG. 1B.

In an embodiment, a cross-point array is used to implement an oscillatory neural network. FIG. 2A depicts an example cross-point array 200a that may be used to implement an oscillatory neural network, such as oscillatory neural network 100b of FIG. 1B.

Cross-point array 200a includes m rows and n columns of nodes $202_{11}, 202_{12}, \ldots, 202_{nm}$. Each column of nodes $202_{11}, 202_{12}, \ldots, 202_{nm}$ is coupled to one of n first conductive lines $204_1, 204_2, \ldots, 204_n$. Each row of nodes $202_{11}, 202_{12}, \ldots, 202_{nm}$ is coupled to one of m second conductive lines $206_1, 206_2, \ldots, 206_m$. Reference number 202 will be used herein to refer generally to a node without regard to any particular one of nodes $202_{11}, 202_{12}, \ldots, 202_{nm}$.

In an embodiment, each node $202_{11}, 202_{12}, \ldots, 202_{nm}$ of cross-point array 200a includes an oscillator circuit having a tunable (also referred to herein as "programmable") oscillation frequency. The programmed oscillation frequency of an oscillator circuit is referred to herein as the "intrinsic frequency" of the oscillator circuit. In an embodiment, the oscillator circuits of nodes $202_{11}, 202_{12}, \ldots, 202_{nm}$ may be programmed to oscillate at corresponding intrinsic frequencies $f_{11}, f_{12}, f_{13}, \ldots, f_{nm}$, respectively. Thus, each node $202_{11}, 202_{12}, \ldots, 202_{nm}$ is labeled with a corresponding intrinsic frequency $f_{11}, f_{12}, f_{13}, \ldots, f_{nm}$, respectively, of the oscillator circuit in the node.

In an embodiment, the oscillator circuits of nodes $202_{11}, 202_{12}, \ldots, 202_{nm}$ may be programmed to corresponding intrinsic frequencies $f_{11}, f_{12}, f_{13}, \ldots, f_{nm}$, respectively, based on signals input to the oscillator circuits. For example, an oscillator circuit may be programmed to oscillate at a particular intrinsic frequency based on a corresponding dc current signal (not depicted in FIG. 2A) injected into the oscillator circuit. That is, an oscillator circuit may be programmed to oscillate at a first intrinsic frequency in response to a first dc current signal injected into the oscillator circuit, and may be programmed to oscillate at a second intrinsic frequency in response to a second dc current signal injected into the oscillator circuit.

In an embodiment, the oscillator circuits of nodes $202_{11}, 202_{12}, \ldots, 202_{nm}$ are programmed to oscillate at particular intrinsic frequencies based on corresponding weights of an m×n array of weights, $w_{11}, w_{12}, w_{13}, \ldots, w_{nm}$, respectively.

For example, each of weights $w_{11}, w_{12}, w_{13}, \ldots, w_{nm}$ may represent an amplitude of a dc current (not depicted in FIG. 2A) injected into the oscillator circuits of nodes $202_{11}, 202_{12}, \ldots, 202_{nm}$, respectively, to program the oscillator circuits to oscillate at intrinsic frequencies $f_{11}, f_{12}, f_{13}, \ldots, f_{nm}$, respectively.

In an embodiment, each of weights $w_{11}, w_{12}, w_{13}, \ldots, w_{nm}$ is associated with corresponding intrinsic frequencies $f_{11}, f_{12}, f_{13}, \ldots, f_{nm}$, respectively. The m×n array of weights, $w_{11}, w_{12}, w_{13}, \ldots, w_{nm}$ and their associated intrinsic frequencies $f_{11}, f_{12}, f_{13}, \ldots, f_{nm}$, respectively, may be determined, for example, during a training phase of the neural network. A common training method involves selectively and/or iteratively updating the weights (and associated intrinsic frequencies) using an algorithm such as back propagation.

In an embodiment, first input signals $Iin_1, Iin_2, \ldots, Iin_n$ are shown applied to first conductive lines $204_1, 204_2, \ldots, 204_n$, respectively. In an embodiment, each first input signal $Iin_1, Iin_2, \ldots, Iin_n$ divides substantially equally into m corresponding second input signals $Ix_1, Ix_2, \ldots, Ix_n$, respectively.

For example, first input signal $Iin_1$ divides substantially equally into m corresponding second input signals $Ix_1 = Iin_1/m$. Likewise, first input signal $Iin_2$ divides substantially equally into m corresponding second input signals $Ix_2 = Iin_2/m$, and so on. In an embodiment, the magnitudes of second input signals $Ix_1, Ix_2, \ldots, Ix_n$ correspond to the associated values of input neurons $x_1, x_2, \ldots x_n$, respectively, of oscillatory neural network 100b of FIG. 1B.

In embodiments, first input signals $Iin_1, Iin_2, \ldots, Iin_n$ are current signals, and will be referred to in the remaining description as first input currents $Iin_1, Iin_2, \ldots, Iin_n$. In embodiments, second input signals $Ix_1, Ix_2, \ldots, Ix_n$ are current signals, and will be referred to in the remaining description as second input currents $Ix_1, Ix_2, \ldots, Ix_n$.

In an embodiment, the oscillator circuits of nodes $202_{11}, 202_{12}, \ldots, 202_{nm}$ are coupled to receive a corresponding one of second input currents $Ix_1, Ix_2, \ldots, Ix_n$, and are configured to provide corresponding oscillator output signals $i_{11}, i_{12}, \ldots, i_{nm}$, respectively. For example, the oscillator circuit of node $202_{11}$ is coupled to receive second input current $Ix_1$, and is configured to provide corresponding oscillator output signal $i_{11}$. Likewise, the oscillator circuit of node $202_{23}$ is coupled to receive second input current $Ix_2$, and is configured to provide corresponding oscillator output signal $i_{23}$, and so on. In embodiments, oscillator output signals $i_{11}, i_{12}, \ldots, i_{nm}$ are current signals, and will be referred to in the remaining description as oscillator output currents $i_{11}, i_{12}, \ldots, i_{nm}$.

In this regard, each oscillator output current is associated with a corresponding second input current. In particular, each oscillator output current is associated with a corresponding second input current received by the oscillator circuit of the node. For example, oscillator output current $i_{11}$ is associated with corresponding second input current $Ix_1$, oscillator output current $i_{23}$ is associated with corresponding second input current $Ix_2$, oscillator output current $i_{n2}$ is associated with corresponding second input current $Ix_n$, and so on.

In addition, the m oscillator output currents provided by the m oscillator circuits in the same column of nodes 202 are each associated with the same corresponding second input current. For example, oscillator output currents $i_{11}, i_{12}, i_{13}, \ldots, i_{1m}$ are each associated with corresponding second input current $Ix_1$, oscillator output currents $i_{31}$, $i_{32}$, $i_{33}$, ..., $i_{3m}$ are each associated with corresponding second input current $Ix_3$, and so on.

In an embodiment, the n oscillator output currents provided by the n oscillator circuits in the same row of nodes 202 sum to form array output signals $Iout_1$, $Iout_2$, ..., $Iout_m$ at the m second conductive lines $206_1$, $206_2$, ..., $206_m$, respectively. For example, oscillator output currents $i_{11}$, $i_{21}$, $i_{31}$, ..., $i_{n1}$ sum to form array output signal $Iout_1$ at second conductive line $206_1$. Likewise, oscillator output currents $i_{13}$, $i_{23}$, $i_{33}$, ..., $i_{n3}$ sum to form array output signal $Iout_3$ at second conductive line $206_3$, and so on. In embodiments, array output signals $Iout_1$, $Iout_2$, ..., $Iout_m$ are current signals, and will be referred to in the remaining description as array output currents $Iout_1$, $Iout_2$, ..., $Iout_m$.

Stated another way, each second conductive line $206_1$, $206_2$, ..., $206_m$, conducts an array output current $Iout_1$, $Iout_2$, ..., $Iout_m$, respectively, equal to a sum of the n oscillator output currents of the n oscillator circuits connected to that second conductive line. Thus, array output currents $Iout_1$, $Iout_2$, ..., $Iout_m$ may be expressed as:

$$Iout_1 = i_{11} + i_{21} + \ldots i_{n1}$$
$$Iout_2 = i_{12} + i_{22} + \ldots i_{n2}$$
$$\ldots$$
$$Iout_m = i_{1m} + i_{2m} + \ldots i_{nm}$$

In an embodiment, first input currents $Iin_1$, $Iin_2$, ..., $Iin_n$ (and corresponding second input currents $Ix_1$, $Ix_2$, ..., $Ix_n$, respectively) each include one or more input signal frequencies. For example, first input current $Iin_1$ (and corresponding second input current $Ix_1$) may include three input signal frequencies $f_{1a}$, $f_{1b}$, $f_{1c}$, first input current $Iin_2$ (and corresponding second input current $Ix_2$) may include one input signal frequency $f_{2a}$, first input current $Iin_3$ (and corresponding second input current $Ix_3$) may include two input signal frequencies $f_{3a}$, $f_{3b}$ and so on. Persons of ordinary skill in the art will understand that first input currents $Iin_1$, $Iin_2$, ..., $Iin_n$ (and corresponding second input currents $Ix_1$, $Ix_2$, ..., $Ix_n$, respectively) each may include more than three input signal frequencies.

In an embodiment, oscillator output currents $i_{11}$, $i_{12}$, ..., $i_{nm}$ each include frequency domain components at the input signal frequencies of their associated corresponding second input current $Ix_1$, $Ix_2$, ..., $Ix_n$. For example, oscillator output current $i_{11}$ is associated with corresponding second input current $Ix_1$, and includes frequency domain components at the input signal frequencies of second input current $Ix_1$. Similarly, oscillator output current $i_{23}$ is associated with corresponding second input current $Ix_2$, and includes frequency domain components at the input signal frequencies of second input current $Ix_2$. Likewise, oscillator output current $i_{n2}$ is associated with corresponding second input current $Ix_n$, and includes frequency domain components at the input signal frequencies of second input current $Ix_n$, and so on.

As described above, the n oscillator output currents provided by the n oscillator circuits in the same row of nodes 202 sum to form array output currents $Iout_1$, $Iout_2$, ..., $Iout_m$. Because the n oscillator circuits in the same row of nodes 202 are coupled to corresponding second input currents $Ix_1$, $Ix_2$, $Ix_3$, ..., $Ix_n$, array output currents $Iout_1$, $Iout_2$, ..., $Iout_m$ each include frequency domain components at the input signal frequencies of second input currents $Ix_1$, $Ix_2$, ..., $Ix_n$.

For example, the oscillator circuits of nodes $202_{11}$, $202_{21}$, $202_{31}$, ..., $202_{n1}$ receive second input currents $Ix_1$, $Ix_2$, $Ix_3$, ..., $Ix_n$, respectively, and provide oscillator output currents $i_{11}$, $i_{21}$, $i_{31}$, ..., $i_{n1}$, respectively, which sum to form array output current $Iout_1$. As described above, oscillator output currents $i_{11}$, $i_{21}$, $i_{31}$, ..., $i_{n1}$ include frequency domain components at the input signal frequencies of their associated corresponding second input current $Ix_1$, $Ix_2$, ..., $Ix_n$, respectively. Accordingly, array output current $Iout_1$ includes frequency domain components at the input signal frequencies of second input currents $Ix_1$, $Ix_2$, ..., $Ix_n$.

Likewise, the oscillator circuits of nodes $202_{13}$, $202_{23}$, $202_{33}$, ..., $202_{n3}$ receive second input currents $Ix_1$, $Ix_2$, $Ix_3$, ..., $Ix_n$, respectively, and provide oscillator output currents $i_{13}$, $i_{23}$, $i_{33}$, ..., $i_{n3}$, respectively, which sum to form array output current $Iout_3$. As described above, oscillator output currents $i_{13}$, $i_{23}$, $i_{33}$, ..., $i_{n3}$ include frequency domain components at the input signal frequencies of their associated corresponding second input current $Ix_1$, $Ix_2$, ..., $Ix_n$, respectively. Accordingly, array output current $Iout_3$ includes frequency domain components at the input signal frequencies of second input currents $Ix_1$, $Ix_2$, ..., $Ix_n$.

Figure 2B:
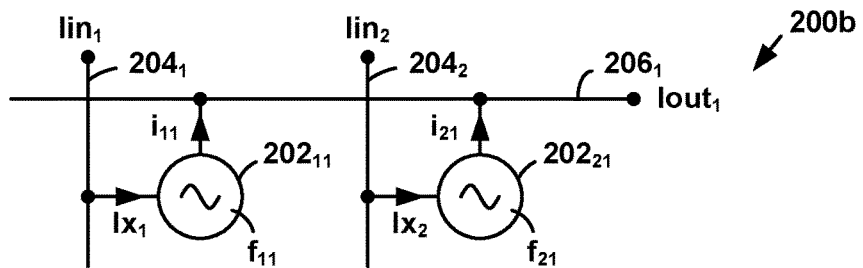
FIG. 2B depicts another example cross-point array that may be used to implement the artificial neural network of FIG. 1B.

To illustrate, FIG. 2B depicts cross-point array 202b that includes a first node $202_{11}$ coupled to first conductive line $204_1$ and second conductive line $206_1$, and a second node $202_{21}$ coupled to first conductive line $204_2$ and second conductive line $206_1$. First node $202_{11}$ includes an oscillator circuit programmed to oscillate at first intrinsic frequency $f_{11}$, and second node $202_{21}$ includes an oscillator circuit programmed to oscillate at second intrinsic frequency $f_{21}$. First input current $Iin_1$ is applied to first conductive line $204_1$, and first input current $Iin_2$ is applied to second conductive line $204_2$.

The oscillator circuit of first node $202_{11}$ receives second input current $Ix_1$ (which equals first input current $Iin_1$ in this example) and provides oscillator output current $i_{11}$. The oscillator circuit of second node $202_{21}$ receives second input current $Ix_2$ (which equals first input current $Iin_2$ in this example) and provides oscillator output current $i_{21}$. Array output current $Iout_1$ is the sum of oscillator output current $i_{11}$ and oscillator output current $i_{21}$.

If first input current $Iin_1$ (and corresponding second input current $Ix_1$) includes input signal frequencies $f_{1a}$, $f_{1b}$, $f_{1c}$, oscillator output current $i_{11}$ includes frequency domain components at input signal frequencies $f_{1a}$, $f_{1b}$, $f_{1c}$ of second input current $Ix_1$. Likewise, if first input current $Iin_2$ (and corresponding second input current $Ix_2$) includes signal frequencies $f_{2a}$, $f_{2b}$, oscillator output current $i_{21}$ includes frequency domain components at input signal frequencies $f_{2a}$, $f_{2b}$ of second input current $Ix_2$.

Array output current $Iout_1$ is the sum of oscillator output current $i_{11}$ and oscillator output current $i_{21}$, and thus array output current $Iout_1$ includes frequency domain components at input signal frequencies $f_{1a}$, $f_{1b}$, $f_{1c}$, $f_{2a}$, $f_{2b}$ of oscillator output current $i_{11}$ and oscillator output current $i_{21}$.

Referring again to FIG. 2A, and as described above, the oscillator circuit of a node 202 may be programmed to oscillate at an intrinsic frequency, and provides an oscillator output current that is associated with a corresponding second input current received by the oscillator circuit. In addition, the oscillator output current includes frequency domain components at the input signal frequencies of the associated corresponding second input current. In an embodiment, the magnitudes of the frequency domain components at the input signal frequencies depend on a degree of synchronization between the input signal frequencies and the intrinsic frequency of the oscillator circuit.

In an embodiment, the oscillator circuit of a node 202 synchronizes its oscillation frequency to that of an input signal frequency of the associated corresponding second input current if a difference between the input signal frequency and the intrinsic frequency is less than or equal to a predetermined threshold $\Delta f$. If the difference between the input signal frequency and the intrinsic frequency is greater than predetermined threshold $\Delta f$, the oscillator circuit does not synchronize its oscillation frequency to the input signal frequency and continues to oscillate at the intrinsic frequency.

Thus, the smaller the difference between the input signal frequency and the intrinsic frequency, the greater the degree of synchronization between the input signal frequency and the intrinsic frequency, and the greater the magnitude of the frequency domain component of the oscillator output current at the input signal frequency. Conversely, the greater the difference between the input signal frequency and the intrinsic frequency, the smaller the degree of synchronization between the input signal frequency and the intrinsic frequency, and the smaller the magnitude of the frequency domain component of the oscillator output current at the input signal frequency.

In an embodiment, array output currents $Iout_1$, $Iout_2, \ldots, Iout_m$ each include frequency domain components at the input signal frequencies of second input currents $Ix_1$, $Ix_2, \ldots, Ix_n$. In an embodiment, the magnitudes of the frequency domain components of an array output current at the input signal frequencies of second input currents $Ix_1$, $Ix_2, \ldots, Ix_n$ depend on a degree of synchronization between the input signal frequencies of second input currents $Ix_1$, $Ix_2, \ldots, Ix_n$ and the intrinsic frequencies of the oscillator circuits of the nodes 202 that collectively provide the array output current.

For example, referring again to FIG. 2B, first node $202_{11}$ includes an oscillator circuit that oscillates at intrinsic frequency $f_{11}$, receives second input current $Ix_1$ and provides oscillator output current $i_{11}$. In addition, second node $202_{21}$ includes an oscillator circuit that oscillates at intrinsic frequency $f_{21}$, receives second input current $Ix_2$ and provides oscillator output current $i_{21}$. Array output current $Iout_1$ is the sum of oscillator output current $i_{11}$ and oscillator output current $i_{21}$.

Figure 2C:
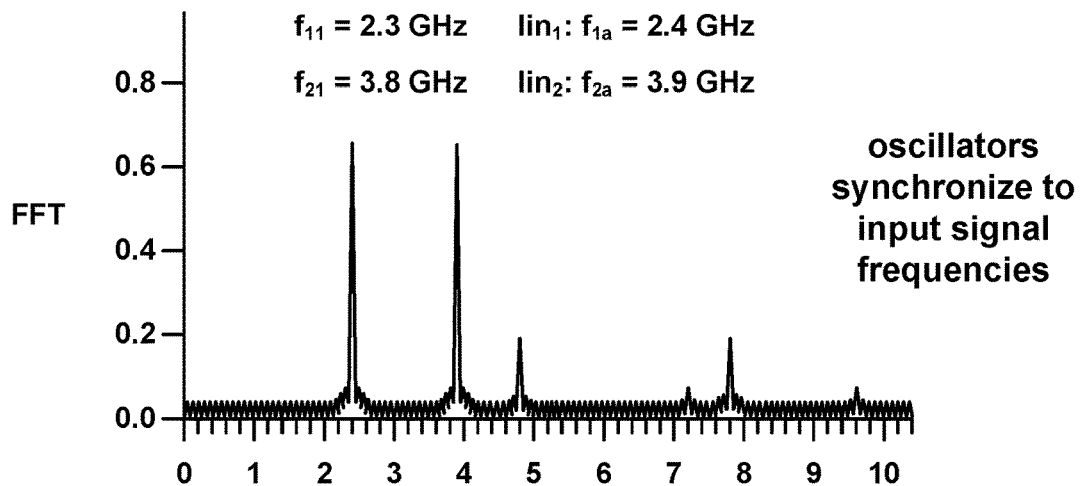
FIG. 2C is a diagram of an example frequency domain spectrum of an array output current of the cross-point array of FIG. 2B.

FIG. 2C depicts a diagram of an example frequency domain spectrum of array output current $Iout_1$ of cross-point array 202b of FIG. 2B, in which the oscillator circuit of first node $202_{11}$ is programmed to oscillate at intrinsic frequency $f_{11}$=2.3 GHz, the oscillator circuit of second node $202_{21}$ is programmed to oscillate at intrinsic frequency $f_{21}$=3.8 GHz, second input current $Ix_1$ includes an input signal frequency $f_{1a}$=2.4 GHz, second input current $Ix_2$ includes an input signal frequency $f_{2a}$=3.9 GHz and predetermined threshold $\Delta f$=0.1 GHz.

For the oscillator circuit of first node $202_{11}$, the difference between input signal frequency $f_{1a}$=2.4 GHz of second input current $Ix_1$ and intrinsic frequency $f_{11}$=2.3 GHz is 0.1 GHz$\leq \Delta f$. As a result, the oscillator circuit of first node $202_{11}$ synchronizes its oscillation frequency to input signal frequency $f_{1a}$=2.4 GHz. Accordingly, the frequency domain spectrum of array output current $Iout_1$ includes a strong peak at input signal frequency $f_{1a}$=2.4 GHz.

For the oscillator circuit of second node $202_{21}$, the difference between input signal frequency $f_{2a}$=3.9 GHz of second input current $Ix_2$ and intrinsic frequency $f_{21}$=3.8 GHz=0.1 GHz$\leq \Delta f$. As a result, the oscillator circuit of second node $202_{21}$ synchronizes its oscillation frequency to input signal frequency $f_{2a}$=3.9 GHz. Accordingly, the frequency domain spectrum of array output current $Iout_1$ includes a strong peak at input signal frequency $f_{2a}$=3.9 GHz.

Figure 2D:
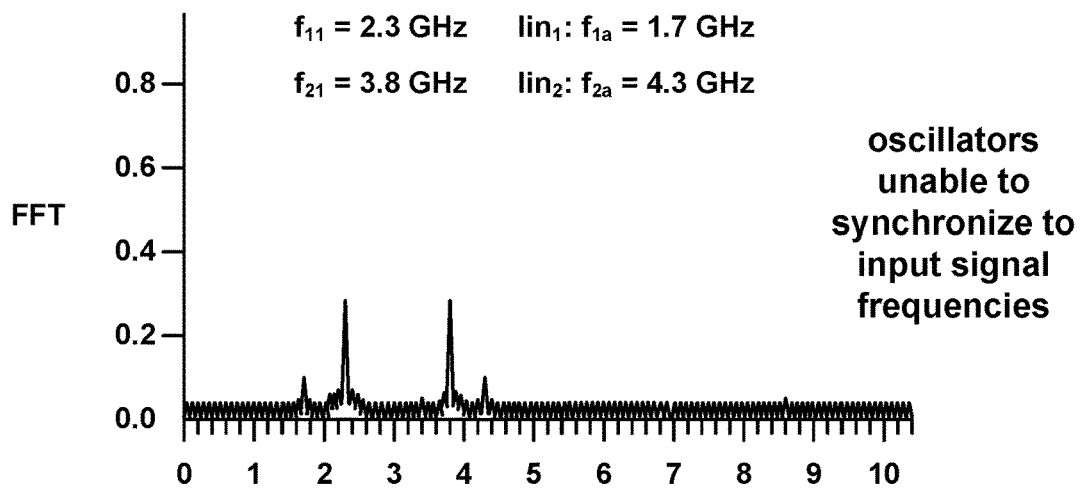
FIG. 2D is a diagram of an example frequency domain spectrum of an array output current of the cross-point array of FIG. 2B.

FIG. 2D depicts a diagram of an example frequency domain spectrum of array output current $Iout_1$ of cross-point array 202b of FIG. 2B, in which the oscillator circuit of first node $202_{11}$ is programmed to oscillate at intrinsic frequency $f_{11}$=2.3 GHz, the oscillator circuit of second node $202_{21}$ is programmed to oscillate at intrinsic frequency $f_{21}$=3.8 GHz, second input current $Ix_1$ includes an input signal frequency $f_{1a}$=1.7 GHz, second input current $Ix_2$ includes an input signal frequency $f_{2a}$=4.3 GHz and predetermined threshold $\Delta f$=0.1 GHz.

For the oscillator circuit of first node $202_{11}$, the difference between input signal frequency $f_{1a}$=1.7 GHz of second input current $Ix_1$ and intrinsic frequency $f_{11}$=2.3 GHz is 0.6 GHz>$\Delta f$. As a result, the oscillator circuit of first node $202_{11}$ does not synchronize its oscillation frequency to input signal frequency $f_{1a}$=1.7 GHz, and instead remains oscillating at intrinsic frequency $f_{11}$=2.3 GHz. Accordingly, the frequency domain spectrum of array output current $Iout_1$ includes a negligible peak at input signal frequency $f_{1a}$=1.7 GHz.

For the oscillator circuit of second node $202_{21}$, the difference between input signal frequency $f_{2a}$=4.3 GHz of second input current $Ix_2$ and intrinsic frequency $f_{21}$=3.8 GHz=0.5 GHz>$\Delta f$. As a result, the oscillator circuit of second node $202_{21}$ does not synchronize its oscillation frequency to input signal frequency $f_{2a}$=4.3 GHz, and instead remains oscillating at intrinsic frequency $f_{21}$=3.8 GHz. Accordingly, the frequency domain spectrum of array output current $Iout_1$ includes a negligible peak at input signal frequency $f_{2a}$=4.3 GHz.

Comparing FIGS. 2C and 2D, the magnitudes of the frequency domain components of an array output current $Iout_1$ at the input signal frequencies of second input currents $Ix_1$ and $Ix_2$ depend on a degree of synchronization between the input signal frequencies of second input currents $Ix_1$ and $Ix_2$, and the intrinsic frequencies of the oscillator circuits of the nodes $202_{11}$ and $202_{21}$ that collectively provide array output current $Iout_1$.

Referring again to FIG. 2A, in an embodiment the oscillator circuit of each of nodes $202_{11}, 202_{12}, \ldots, 202_{nm}$ may be implemented as an SOT-based STO. FIGS. 3A1-3A2 depict cross-sectional and top-down views, respectively, of an SOT-based STO 300a that may be included in the oscillator circuit of each of nodes $202_{11}, 202_{12}, \ldots, 202_{nm}$ of FIG. 2A. SOT-based STO 300a includes a first terminal A, a second terminal B, a third terminal C, a magnetic tunnel junction (MTJ) 302a, and a spin Hall effect (SHE) layer 304. As depicted in FIG. 3A2, MTJ 302a has a substantially cylindrical shape.

MTJ 302a includes a reference (or pinned) layer (PL) 306a, a free layer (FL) 308a, and a tunnel barrier (TB) 310 positioned between pinned layer 306a and free layer 308a. Tunnel barrier 310 is an insulating layer, such as magnesium oxide (MgO) or other insulating material. Pinned layer 306a is a ferromagnetic layer with a fixed magnetization direction. Free layer 308a is a ferromagnetic layer and has a magnetization direction that can be switched by spin torque.

Although not depicted in FIG. 3A1, SOT-based STO 300a optionally may include a dusting layer (e.g., AlO, TaO, YIG or other similar material that has relatively a high resistivity and a long spin diffusion) disposed between free layer 308a and SHE layer 304. As described in more detail below, a dusting layer may be used to substantially electrically isolate MTJ 302a and SHE layer 304 while allowing spin current to flow vertically from SHE layer 304 into MTJ 302a.

Pinned layer 306a is usually a synthetic antiferromagnetic layer which includes several magnetic and non-magnetic layers, but for the purpose of this illustration is depicted as a single layer 306a with fixed magnetization direction. Pinned layer 306a and free layer 308a each have a magnetization direction that is perpendicular to the film plane (e.g., the x-y plane in FIG. 3A1), rather than in-plane. Accordingly SOT-based STO 300a is also referred to herein as "perpendicular stack SOT-based STO 300a."

When the magnetization direction of free layer 308a is parallel to the magnetization direction of pinned layer 306a, the resistance of perpendicular stack SOT-based STO 300a is relatively low. When the magnetization direction of free layer 308a is anti-parallel to the magnetization direction of pinned layer 306a, the resistance of perpendicular stack SOT-based STO 300a is relatively high.

FIG. 3B1 is a cross-sectional view of another SOT-based STO 300b that may be included in the oscillator circuit of each of nodes $202_{11}$, $202_{12}$, ..., $202_{nm}$ of FIG. 2A. SOT-based STO 300b includes first terminal A, second terminal B, third terminal C, a MTJ 302b having a pinned layer PL 306b and a free layer FL 308b that each have a magnetization direction that is in an in-plane direction, and SHE layer 304. Accordingly SOT-based STO 300b is also referred to herein as "in-plane stack SOT-based STO 300b." As depicted in FIG. 3B, optional dusting layer (DL) 316 (e.g., AlO, TaO, YIG or other similar material that has relatively a high resistivity and a long spin diffusion) disposed between free layer 308b and SHE layer 304.

When the magnetization direction of free layer 308b is parallel to the magnetization direction of pinned layer 306b, the resistance of in-plane stack SOT-based STO 300b is relatively low. When the magnetization direction of free layer 308b is anti-parallel to the magnetization direction in pinned layer 306b, the resistance of in-plane stack SOT-based STO 300b is relatively high.

FIG. 3B2 is a top-down view of an embodiment of in-plane stack SOT based STO 300b. In this embodiment, MTJ 302b has an ellipsoidal shape, and pinned layer 306b and free layer 308b each have an easy axis perpendicular to current flow in SHE layer 314. FIG. 3B3 is a top-down view of another embodiment of in-plane stack SOT-based STO 300b. In this embodiment, MTJ 302b has an ellipsoidal shape, and pinned layer 306b and free layer 308b each have an easy axis that is at an angle α off-perpendicular to current flow in SHE layer 314. In embodiments, angle α may be between about 0° to about 30°, although other angles may be used.

For simplicity, the remaining description will refer to perpendicular stack SOT-based STOs, such as SOT-based STO 300a of FIGS. 3A1-3A2. Referring again to FIG. 3A1, in an embodiment SHE layer 304 comprises a heavy metal with strong spin orbit coupling and large effective spin Hall angle. Examples of heavy metal materials include platinum, tungsten, tantalum, platinum doped with gold (PtAu), bismuth doped with copper (BiCu).

In other embodiments, SHE layer 304 comprises a topological insulator, such as bismuth antimony (BiSb), bismuth selenide ($Bi_2Se_3$), bismuth telluride ($Bi_2Te_3$) or antimony telluride ($Sb_2Te_3$). In particular embodiments, SHE layer 304 comprises BiSb with (012) orientation, which is a narrow gap topological insulator with both giant spin Hall effect and high electrical conductivity. In still other embodiments, SHE layer 304 may comprise one or more of a heavy metal and a topological insulator. That is, SHE layer 304 may comprise a heavy metal, a topological insulator, or a combination of a heavy metal and a topological insulator.

The spin of an electron is an intrinsic angular momentum. In a solid, the spins of many electrons can act together to affect the magnetic and electronic properties of a material, for example endowing the material with a permanent magnetic moment as in a ferromagnet. In many materials, electron spins are equally present in both up and down directions. However, various techniques can be used to generate a spin-polarized population of electrons, resulting in an excess of spin up or spin down electrons, to change the properties of a material. This spin-polarized population of electrons moving in a common direction through a common material is referred to as a spin current.

The spin Hall effect is a transport phenomenon that may be used to generate a spin current in a sample carrying an electric current. The spin current is in a direction perpendicular to the plane defined by the electrical current direction and the spin polarization direction. The spin polarization direction of such a SHE-generated spin current is in the in-plane direction orthogonal to the electrical current flow.

For example, an electrical bias current 312 through SHE layer 304 (from first terminal A to third terminal C) results in a spin current 314 being injected up into free layer 308a, and having a direction of polarization into the page. Spin current 314 injected into free layer 308a exerts a spin torque (or "kick") on free layer 308a, which causes the magnetization direction of free layer 308a to oscillate. As a result, SOT-based STO 300a has a time-varying AC resistance between second terminal B and third terminal C, with the same frequency as the oscillation frequency of magnetization direction of free layer 308a.

Ideally, electrical bias current 312 flows entirely through SHE layer 304 (from first terminal A to third terminal C). In practice, however, a portion of electrical bias current 312 may also flow through MTJ 302a (partially shunted), which is not useful. To reduce the portion of bias current 312 flowing through MTJ 302a, a dusting layer optionally may be disposed between SHE layer 304 and free layer 308a.

As described above, examples of dusting layer materials include AlO, TaO, YIG or other similar material that has relatively a high resistivity and a long spin diffusion. In embodiments, the dusting layer substantially electrically isolates MTJ 302a and SHE layer 304 to reduce the portion of bias current 312 flowing through MTJ 302a, while allowing spin current 314 being injected up into free layer 308a.

FIG. 3C1 is a diagram of an embodiment of an oscillator circuit 318 that may be used as the oscillator circuit of each of nodes $202_{11}$, $202_{12}$, ..., $202_{nm}$ of FIG. 2A. Oscillator circuit 318 includes SOT-based STO 300a of FIG. 3A, including first terminal A, second terminal B coupled to a voltage-to-current converter circuit 320, and third terminal C coupled to GROUND. Voltage-to-current converter circuit 320 converts a voltage at second terminal B to an oscillator output current Iout. Oscillator circuit 318 will be referred to in the remaining description as SOT-based STO circuit 318.

A DC input current Idc injected into first terminal A forms bias current 312, which flows through SHE layer 304 from first terminal A to third terminal C to GROUND. Bias current 312 results in spin current 314 being injected into free layer 308a. Spin current 314 exerts a spin torque on free layer 308a, which causes the magnetization direction of free layer 308a to oscillate. Voltage-to-current converter circuit 320 converts an oscillating voltage at second terminal B to oscillator output current Iout. In an embodiment, oscillator output current Iout has a frequency equal to the oscillation frequency of the magnetization direction of free layer 308a.

In an embodiment, SOT-based STO circuit 318 has an intrinsic frequency $f_0$ that can be tuned based on the value of DC input current Idc (and/or some local magnetic field). FIG. 3C2 depicts an example diagram of intrinsic frequency $f_0$ versus DC input current Idc for SOT-based STO circuit 318. In particular, the solid curve represents the intrinsic frequency $f_0$ of SOT-based STO circuit 318 for values of DC input current Idc between about 250 µA and about 400 µA.

In the illustrated example, intrinsic frequency $f_0$ can be tuned (or programmed) over a fairly wide range of frequencies (e.g., between about 2 GHz and about 8 GHz) based on the values of DC input current Idc. Persons of ordinary skill in the art will understand that other DC input current Idc values, intrinsic frequency $f_0$ values and curve shapes may be used.

Referring again to FIG. 3C1, if a radio frequency (RF) input current Irf at a frequency $f_i$ is also injected into first terminal A (e.g., via a bypass capacitor Cb), Idc and Irf collectively form bias current 312, which flows through SHE layer 304 from first terminal A to third terminal C to GROUND. In an embodiment, the oscillation frequency of SOT-based STO circuit 318 synchronizes to the RF input signal frequency $f_i$ if the difference between the RF input signal frequency $f_i$ and the intrinsic frequency $f_0$ is less than or equal to a predetermined threshold $\Delta f$. In an embodiment, predetermined threshold $\Delta f$ may be about 0.1 GHz, although other values may be used.

Referring again to FIG. 3C2, for a range of DC input current Ide values Isync, the oscillation frequency of SOT-based STO circuit 318 synchronizes to the RF input signal frequency $f_i$ (e.g., about 6 GHz in this example). In the illustrated example, over the range of DC input current Idc values Isync, the intrinsic frequency $f_0$ of SOT-based STO circuit 318 extends from about $(f_i-\Delta f)$ to about $(f_i+\Delta f)$. Thus, if $(f_i-\Delta f) \leq f_0 \leq (f_i+\Delta f)$, SOT-based STO circuit 318 synchronizes to the RF input signal frequency $f_i$. Conversely, if $f_0 < (f_i-\Delta f)$ or $f_0 > (f_i+\Delta f)$, SOT-based STO circuit 318 is unable to synchronize to the RF input signal frequency $f_i$, and oscillates at intrinsic frequency $f_0$. Persons of ordinary skill in the art will understand that other Isync values and input signal frequency $f_i$ values may be used.

FIG. 3D1 depicts a cross-sectional of another SOT-based STO 300c1 that may be included in the oscillator circuit of each of nodes $202_{11}$, $202_{12}$, ..., $202_{nm}$ of FIG. 2A. SOT-based STO 300c1 includes first terminal A, second terminal B, MTJ 302a, and SHE layer 304. In contrast to SOT-based STO 300a of FIG. 3A1, which is a three-terminal device, SOT-based STO 300c1 is a two-terminal device.

An electrical bias current 312 through SHE layer 304 and MTJ 302a (from first terminal A to second terminal B) results in a spin current (not shown) being injected up into free layer 308a, and having a direction of polarization into the page. The spin current injected into free layer 308a exerts a spin orbit torque on free layer 308a. In addition, spin-polarized electrons from electrical bias current 312 impart a spin transfer torque on the magnetization of free layer 308a.

The combined effects of spin orbit torque and spin transfer torque causes the magnetization direction of free layer 308a to oscillate. As a result, SOT-based STO 300c1 has a time-varying AC resistance between first terminal A and second terminal B, with the same frequency as the oscillation frequency of magnetization direction of free layer 308a. As a result, SOT-based STO 300c1 may be included as a two-terminal oscillator in an oscillator circuit, such as oscillator circuit 318 of FIG. 3C1 (without needing third terminal C).

FIG. 3D2 depicts a cross-sectional of another two-terminal SOT-based STO 300c2 that may be included in the oscillator circuit of each of nodes $202_1$, $202_{12}$, ..., $202_{nm}$ of FIG. 2A. SOT-based STO 300c2 is identical to SOT-based STO 300c1 of FIG. 3D1, but also includes dusting layer 316 disposed between SHE layer 304 and free layer 308a.

FIG. 3E1 depicts a cross-sectional of another two-terminal SOT-based STO 300d1 that may be included in the oscillator circuit of each of nodes $202_{11}$, $202_{12}$, ..., $202_{nm}$ of FIG. 2A. SOT-based STO 300d1 is similar to SOT-based STO 300c1 of FIG. 3D1, but also includes a shunt resistance Ro in parallel with MTJ 302a, having a first end coupled to SHE layer 304, and a second end coupled to second terminal B.

Shunt resistance $R_0$ may be a non-magnetic material having a resistance that may be tuned to control an amount of electrical bias current 312 flowing vertically through MTJ 302a. In an embodiment, shunt resistance $R_0$ may be tuned to a resistance value approximately equal to the dc resistance of MTJ 302a, so that electrical bias current 312 divides substantially equally between MTJ 302a and shunt resistance $R_0$.

FIG. 3E2 depicts a cross-sectional of another two-terminal SOT-based STO 300d2 that may be included in the oscillator circuit of each of nodes $202_1$, $202_{12}$, ..., $202_{nm}$ of FIG. 2A. SOT-based STO 300d2 is identical to SOT-based STO 300d1 of FIG. 3E1, but also includes dusting layer 316 disposed between SHE layer 304 and free layer 308a.

Figure 4:
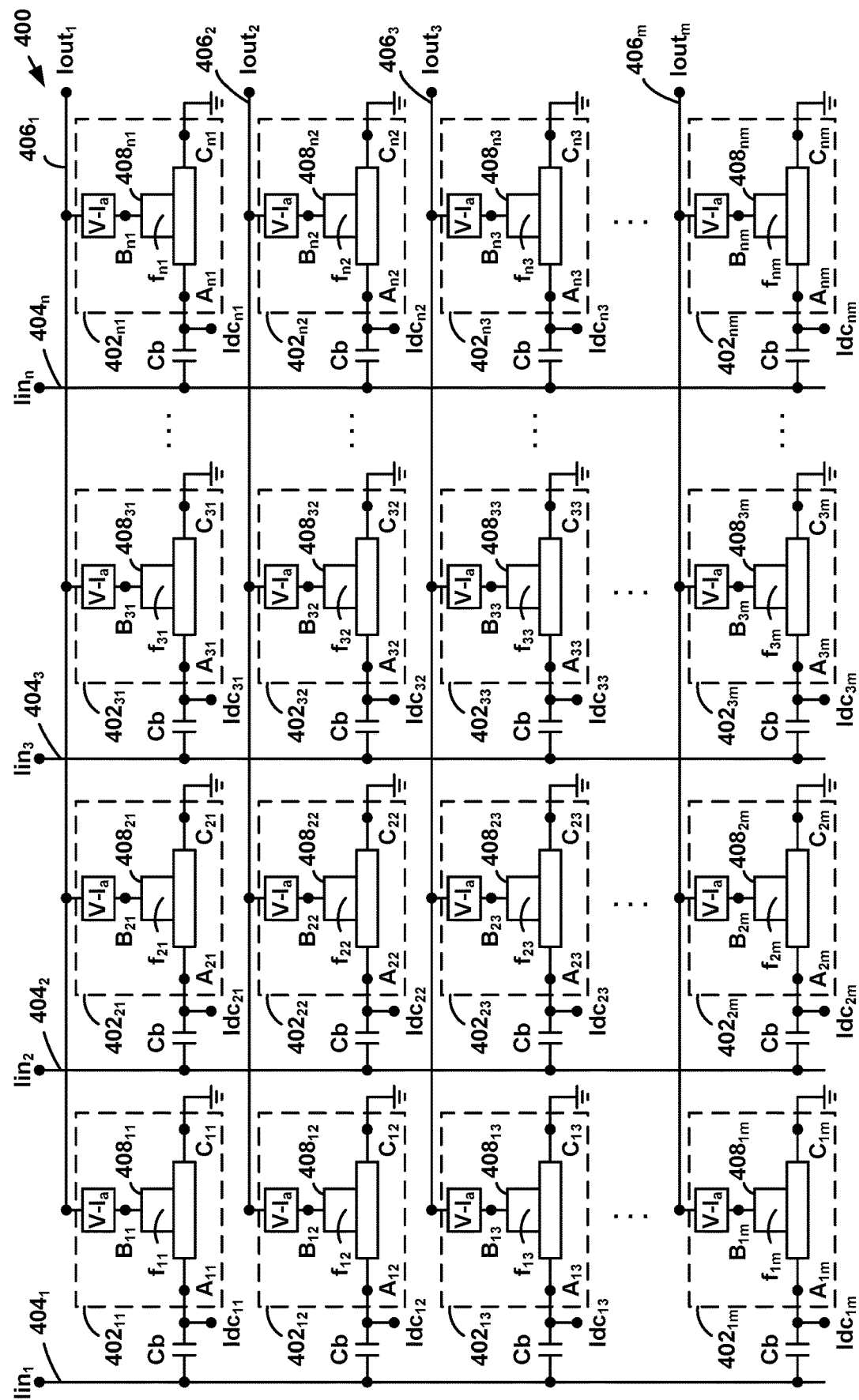
FIG. 4 depicts an example embodiment of the cross-point array of FIG. 2A.

FIG. 4 is a simplified diagram of a cross-point array 400 that may be used to implement an oscillatory neural network. Cross-point array 400 is an example embodiment of cross-point array 200a of FIG. 2A, and may be used to implement an oscillatory neural network, such as oscillatory neural network 100b of FIG. 1B.

Cross-point array 400 includes m rows and n columns of nodes $402_{11}$, $402_{12}$, ..., $402_{nm}$. Each column of nodes $402_{11}$, $402_{12}$, ..., $402_{nm}$ is coupled to one of n first conductive lines $404_1$, $404_2$, ..., $404_n$. Each row of nodes $402_{11}$, $402_{12}$, ..., $402_{nm}$ is coupled to one of m second conductive lines $406_1$, $406_2$, ..., $406_m$.

In an embodiment, each node $402_{11}$, $402_{12}$, ..., $402_{nm}$ of cross-point array 400 includes an oscillator circuit that includes an SOT-based STO $408_{11}$, $408_{12}$, ..., $408_{nm}$, respectively, and a voltage-to-current converter circuit V-$I_a$. In embodiments, each SOT-based STO $408_{11}$, $408_{12}$, ..., $408_{nm}$ may be implemented using SOT-based STO 300a of FIG. 3A1 or SOT-based STO 300b of FIG. 3B1.

In an embodiment, each oscillator circuit of nodes $402_{11}$, $402_{12}$, ..., $402_{nm}$ has a tunable/programmable intrinsic frequency. In an embodiment, the oscillator circuits of nodes $402_{11}$, $402_{12}$, ..., $402_{nm}$ may be programmed to oscillate at corresponding intrinsic frequencies $f_{11}$, $f_{12}$, $f_{13}$, ..., $f_{nm}$, respectively. Thus, each node $402_{11}$, $402_{12}$, ..., $402_{nm}$ is labeled with a corresponding intrinsic frequency $f_{11}$, $f_{12}$, $f_{13}$, ..., $f_{nm}$, respectively, of the oscillator circuit in the node.

Each SOT-based STO $408_{11}$, $408_{12}$, ..., $408_{nm}$, includes a first terminal $A_{11}$, $A_{12}$, ..., $A_{nm}$, respectively, a second terminal $B_{11}$, $B_{12}$, ..., $B_{nm}$, respectively, and a third terminal $C_{11}$, $C_{12}$, ..., $C_{nm}$, respectively. First terminals $A_{11}$, $A_{12}$, ..., $A_{nm}$ are coupled to DC input currents $Idc_{11}$, $Idc_{12}$, ..., $Idc_{nm}$, respectively, and are also coupled via bypass capacitors Cb to corresponding first input currents $Iin_1$, $Iin_2$, ..., $Iin_n$. Second terminals $B_{11}$, $B_{12}$, ..., $B_{nm}$ are each coupled to a voltage-to-current converter circuit V-$I_a$, described in more detail below. Third terminals $C_{11}$, $C_{12}$, ..., $C_{nm}$ are each coupled to GROUND.

In an embodiment, the oscillator circuits of nodes $402_{11}$, $402_{12}$, ..., $402_{nm}$ may be programmed to corresponding intrinsic frequencies $f_{11}$, $f_{12}$, $f_{13}$, ..., $f_{nm}$, respectively, based on DC input currents $Idc_{11}$, $Idc_{12}$, ..., $Idc_{nm}$ (and maybe some optional magnetic field), respectively, injected into the oscillator circuits of nodes $402_{11}$, $402_{12}$, ..., $402_{nm}$, respectively.

In an embodiment, the oscillator circuits of nodes $402_{11}$, $402_{12}$, ..., $402_{nm}$ are programmed to oscillate at particular intrinsic frequencies based on corresponding weights of an m×n array of weights, $w_{11}$, $w_{12}$, $w_{13}$, ..., $w_{nm}$, respectively. For example, each of weights $w_{11}$, $w_{12}$, $w_{13}$, ..., $w_{nm}$ may represent an amplitude of corresponding DC input currents $Idc_{11}$, $Idc_{12}$, ..., $Idc_{nm}$, respectively, injected into the oscillator circuits of nodes $402_{11}$, $402_{12}$, ..., $402_{nm}$, respectively, to program the oscillator circuits to oscillate at intrinsic frequencies $f_{11}$, $f_{12}$, $f_{13}$, ..., $f_{nm}$, respectively.

In an embodiment, during a "programming phase," the intrinsic frequency of each SOT-based STO $408_{11}$, $408_{12}$, ..., $408_{nm}$ is programmed using a corresponding weight of an m×n array of weights $w_{11}$, $w_{12}$, $w_{13}$, ..., $w_{nm}$, respectively, each of which represents an amplitude of corresponding DC input currents $Idc_{11}$, $Idc_{12}$, ..., $Idc_{nm}$, respectively, injected into the oscillator circuits of nodes $402_{11}$, $402_{12}$, ..., $402_{nm}$, respectively After each SOT-based STO $408_{11}$, $408_{12}$, ..., $408_{nm}$ has been programmed with weights $w_{11}$, $w_{12}$, $w_{13}$, ..., $w_{nm}$, respectively, e.g., as part of training a neural network, cross-point array 400 may be used during an "inferencing phase" to perform neuromorphic computing. In an embodiment, first input currents $Iin_1$, $Iin_2$, ..., $Iin_n$ are shown applied to first conductive lines $404_1$, $404_2$, ..., $404_n$, respectively.

In an embodiment, each first input current $Iin_1$, $Iin_2$, ..., $Iin_n$ divides substantially equally into m corresponding second input currents (not shown to avoid overcrowding the drawing). In an embodiment, the magnitudes of the second input currents correspond to the associated values of input neurons $x_1$, $x_2$, ... $x_n$ of oscillatory neural network 100b of FIG. 1B.

In an embodiment, during the inferencing phase the oscillator circuits of nodes $402_{11}$, $402_{12}$, ..., $402_{nm}$ are coupled to receive a corresponding one of the second input currents and are configured to provide corresponding oscillator output currents (not shown to avoid overcrowding the drawing). In an embodiment, each SOT-based STO $408_{11}$, $408_{12}$, ..., $408_{nm}$ oscillates at a corresponding intrinsic frequency $f_{11}$, $f_{12}$, $f_{13}$, ..., $f_{nm}$, respectively. In an embodiment, the n oscillator output currents provided by the n oscillator circuits in the same row of nodes sum to form array output currents $Iout_1$, $Iout_2$, ..., $Iout_m$ at the m second conductive lines $406_1$, $406_2$, ..., $406_m$, respectively.

Figure 5:
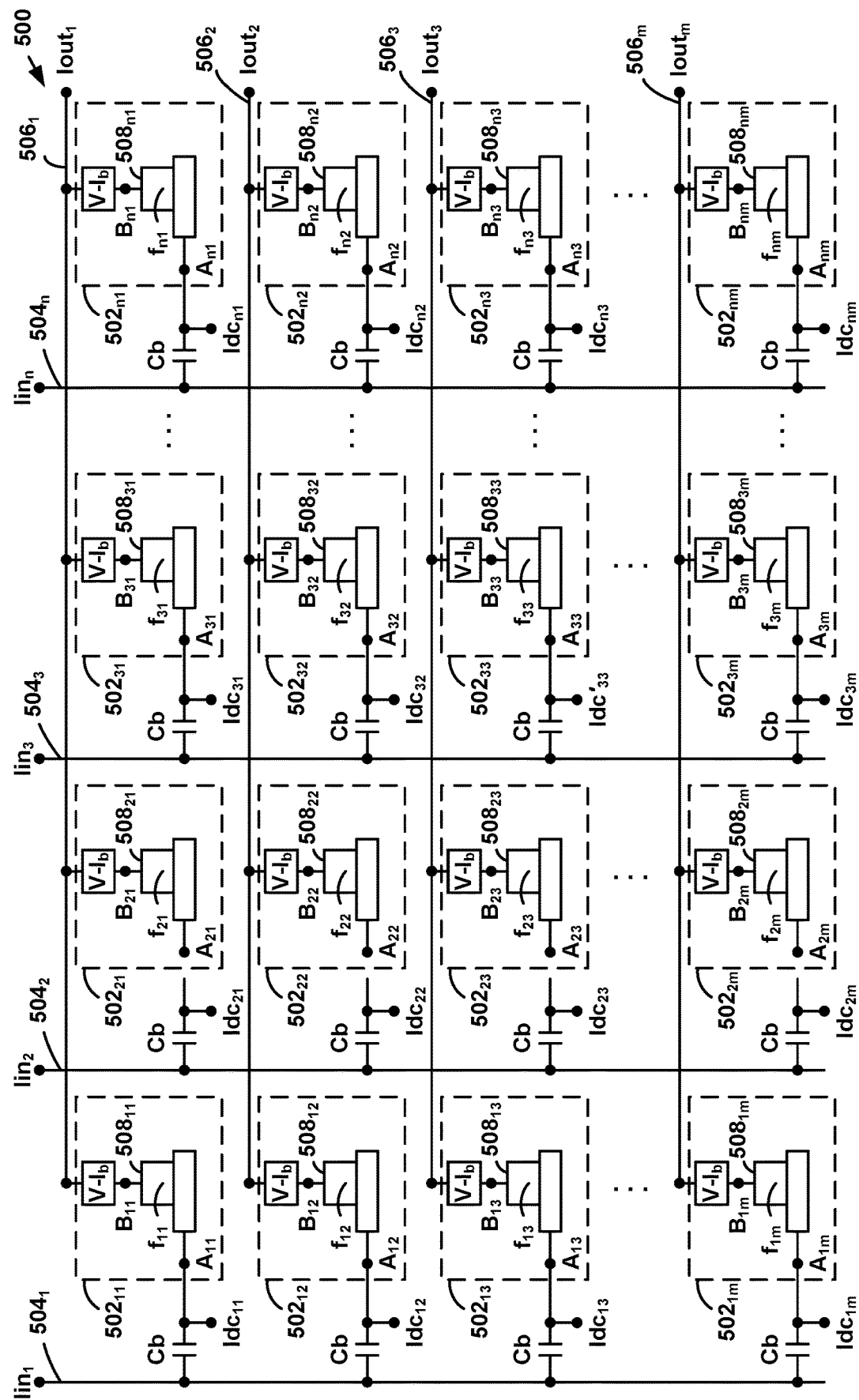
FIG. 5 depicts another example embodiment of the cross-point array of FIG. 2A.

FIG. 5 is a simplified diagram of a cross-point array 500 that may be used to implement an oscillatory neural network. Cross-point array 500 is an example embodiment of cross-point array 200a of FIG. 2A, and may be used to implement an oscillatory neural network, such as oscillatory neural network 100b of FIG. 1B.

Cross-point array 500 includes m rows and n columns of nodes $502_{11}$, $502_{12}$, ..., $502_{nm}$. Each column of nodes $502_{11}$, $502_{12}$, ..., $502_{nm}$ is coupled to one of n first conductive lines $504_1$, $504_2$, ..., $504_n$. Each row of nodes $502_{11}$, $502_{12}$, ..., $502_{nm}$ is coupled to one of m second conductive lines $506_1$, $506_2$, ..., $506_m$.

In an embodiment, each node $502_{11}$, $502_{12}$, ..., $502_{nm}$ of cross-point array 500 includes an oscillator circuit that includes an SOT-based STO $508_{11}$, $508_{12}$, ..., $508_{nm}$, respectively, and a voltage-to-current converter circuit V-$I_b$. In embodiments, each SOT-based STO $508_{11}$, $508_{12}$, ..., $508_{nm}$ may be implemented using any of SOT-based STO 300c1 of FIG. 3D1, SOT-based STO 300c2 of FIG. 3D2, SOT-based STO 300d1 of FIG. 3E1 and SOT-based STO 300d2 of FIG. 3E2.

In an embodiment, each oscillator circuit of nodes $502_{11}$, $502_{12}$, ..., $502_{nm}$ has a tunable/programmable intrinsic frequency. In an embodiment, the oscillator circuits of nodes $502_{11}$, $502_{12}$, ..., $502_{nm}$ may be programmed to oscillate at corresponding intrinsic frequencies $f_{11}$, $f_{12}$, $f_{13}$, ..., $f_{nm}$, respectively. Thus, each node $502_{11}$, $502_{12}$, ..., $502_{nm}$ is labeled with a corresponding intrinsic frequency $f_{11}$, $f_{12}$, $f_{13}$, ..., $f_{nm}$, respectively, of the oscillator circuit in the node.

Each SOT-based STO $508_{11}$, $508_{12}$, ..., $508_{nm}$, includes a first terminal $A_{11}$, $A_{12}$, ..., $A_{nm}$, respectively, and a second terminal $B_{11}$, $B_{12}$, ..., $B_{nm}$, respectively. First terminals $A_{11}$, $A_{12}$, ..., $A_{nm}$ are coupled to DC input currents $Idc_{11}$, $Idc_{12}$, ..., $Idc_{nm}$, respectively, and are also coupled via bypass capacitors Cb to corresponding first input currents $Iin_1$, $Iin_2$, ..., $Iin_n$. Second terminals $B_{11}$, $B_{12}$, ..., $B_{nm}$ are each coupled to a voltage-to-current converter circuit V-$I_b$, described in more detail below.

In an embodiment, the oscillator circuits of nodes $502_{11}$, $502_{12}$, ..., $502_{nm}$ may be programmed to corresponding intrinsic frequencies $f_{11}$, $f_{12}$, $f_{13}$, ..., $f_{nm}$, respectively, based on DC input currents $Idc_{11}$, $Idc_{12}$, ..., $Idc_{nm}$ (and maybe some optional magnetic field), respectively, injected into the oscillator circuits of nodes $502_{11}$, $502_{12}$, ..., $502_{nm}$, respectively.

In an embodiment, the oscillator circuits of nodes $502_{11}$, $502_{12}$, ..., $502_{nm}$ are programmed to oscillate at particular intrinsic frequencies based on corresponding weights of an m×n array of weights, $w_{11}$, $w_{12}$, $w_{13}$, ..., $w_{nm}$, respectively. For example, each of weights $w_{11}$, $w_{12}$, $w_{13}$, ..., $w_{nm}$ may represent an amplitude of corresponding DC input currents $Idc_{11}$, $Idc_{12}$, ..., $Idc_{nm}$, respectively, injected into the oscillator circuits of nodes $502_{11}$, $502_{12}$, ..., $502_{nm}$, respectively, to program the oscillator circuits to oscillate at intrinsic frequencies $f_{11}$, $f_{12}$, $f_{13}$, ..., $f_{nm}$, respectively.

In an embodiment, during a programming phase, the intrinsic frequency of each SOT-based STO $508_{11}$, $508_{12}$, ..., $508_{nm}$ is programmed using a corresponding weight of an m×n array of weights $w_{11}$, $w_{12}$, $w_{13}$, ..., $w_{nm}$, respectively, each of which represents an amplitude of corresponding DC input currents $Idc_{11}$, $Idc_{12}$, ..., $Idc_{nm}$, respectively, injected into the oscillator circuits of nodes $502_{11}$, $502_{12}$, ..., $502_{nm}$, respectively After each SOT-based STO $508_{11}$, $508_{12}$, ..., $508_{nm}$ has been programmed with weights $w_{11}$, $w_{12}$, $w_{13}$, ..., $w_{nm}$, respectively, e.g., as part of training a neural network, cross-point array 500 may be used during an inferencing phase to perform neuromorphic computing. In an embodiment, first input currents $Iin_1$, $Iin_2$, ..., $Iin_n$ are shown applied to first conductive lines $504_1$, $504_2$, ..., $504_n$, respectively.

In an embodiment, each first input current $Iin_1$, $Iin_2$, ..., $Iin_n$ divides substantially equally into m corresponding second input currents (not shown to avoid overcrowding the drawing). In an embodiment, the magnitudes of the second input currents correspond to the associated values of input neurons $x_1, x_2, \ldots x_n$ of oscillatory neural network 100b of FIG. 1B.

In an embodiment, during the inferencing phase the oscillator circuits of nodes $502_{11}, 502_{12}, \ldots, 502_{nm}$ are coupled to receive a corresponding one of the second input currents and are configured to provide corresponding oscillator output currents (not shown to avoid overcrowding the drawing). In an embodiment, each SOT-based STO $508_{11}, 508_{12}, \ldots, 508_{nm}$ oscillates at a corresponding intrinsic frequency $f_{11}, f_{12}, f_{13}, \ldots, f_{nm}$, respectively. In an embodiment, the n oscillator output currents provided by the n oscillator circuits in the same row of nodes sum to form array output currents $Iout_1, Iout_2, \ldots, Iout_m$ at the m second conductive lines $506_1, 506_2, \ldots 506_m$, respectively.

Figure 6A:
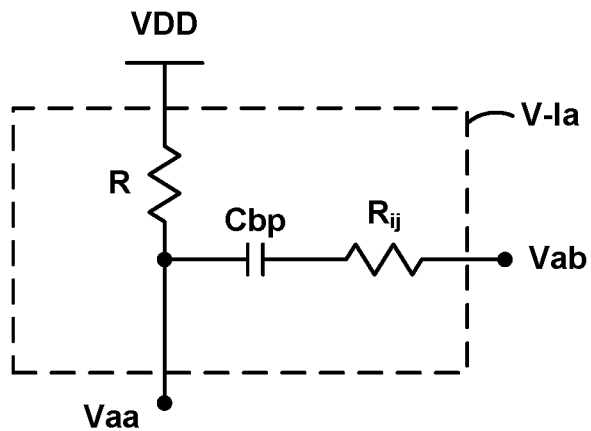
FIG. 6A is a circuit diagram of a voltage-to-current converter that may be used in the oscillator circuits of FIG. 4.

As described above, each node $402_{11}, 402_{12}, \ldots, 402_{nm}$ of cross-point array 400 includes an oscillator circuit that includes a voltage-to-current converter circuit V-$I_a$. FIG. 6A is a circuit diagram of an example voltage-to-current converter circuit V-$I_a$ that may be used in the oscillator circuits of cross-point array 400.

In particular, voltage-to-current converter circuit V-$I_a$ includes a resistor R having a first terminal Vaa and a second terminal coupled to a power supply terminal (e.g., VDD). First terminal Vaa is also coupled to a first terminal of a bypass capacitor Cbp. Bypass capacitor Cbp has a second terminal coupled to a first terminal of a resistor Rij, which has a second terminal Vab.

In an embodiment, each first terminal Vaa is coupled to a corresponding second terminal $B_{11}, B_{12}, \ldots, B_{nm}$ of SOT-based STOs $408_{11}, 408_{12}, \ldots, 408_{nm}$, respectively, of cross-point array 400 of FIG. 4, and each second terminal Vab is coupled to a corresponding second conductive line $406_1, 406_2, \ldots, 406_m$ of cross-point array 400.

In an embodiment, resistor R is used as a voltage divider, and has a resistance approximately equal to the DC resistance of the SOT-based STOs of cross-point array 400 (e.g., each of SOT-based STO $408_{11}, 408_{12}, \ldots, 408_{nm}$ will have approximately the same DC resistance). Resistor Rij has a resistance value selected so that the oscillator output currents of the oscillator circuits of nodes $402_{11}, 402_{12}, \ldots, 402_{nm}$ is of approximately the same order as the second input currents coupled to the oscillator circuits of nodes $402_{11}, 402_{12}, \ldots, 402_{nm}$. Persons of ordinary skill in the art will understand that other voltage-to-current converter circuits may be used in the oscillator circuits of cross-point array 400.

Figure 6B:
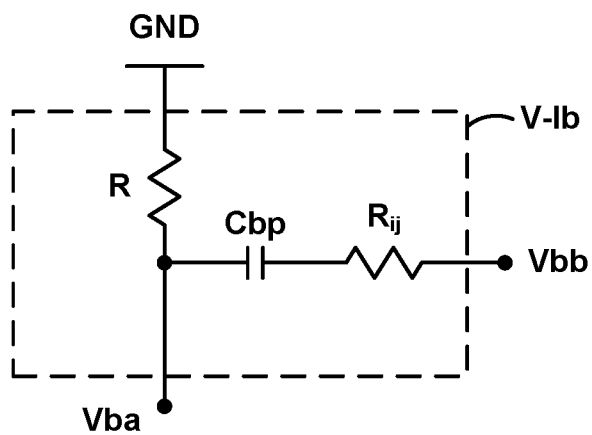
FIG. 6B is a circuit diagram of a voltage-to-current converter that may be used in the oscillator circuits of FIG. 5.

As described above, each node $502_{11}, 502_{12}, \ldots, 502_{nm}$ of cross-point array 500 includes an oscillator circuit that includes a voltage-to-current converter circuit V-$I_b$. FIG. 6B is a circuit diagram of an example voltage-to-current converter circuit V-$I_b$ that may be used in the oscillator circuits of cross-point array 500.

In particular, voltage-to-current converter circuit V-$I_b$ includes a resistor R having a first terminal Vba and a second terminal coupled to a GROUND. First terminal Vba is also coupled to a first terminal of a bypass capacitor Cbp. Bypass capacitor Cbp has a second terminal coupled to a first terminal of a resistor Rij, which has a second terminal Vbb.

In an embodiment, each first terminal Vba is coupled to a corresponding second terminal $B_{11}, B_{12}, \ldots, B_{nm}$ of SOT-based STOs $508_{11}, 508_{12}, \ldots, 508_{nm}$, respectively, of cross-point array 500 of FIG. 5, and each second terminal Vbb is coupled to a corresponding second conductive line $506_1, 506_2, \ldots, 506_m$ of cross-point array 500.

In an embodiment, resistor R is used as a voltage divider, and has a resistance approximately equal to the DC resistance of the SOT-based STOs of cross-point array 500 (e.g., each of SOT-based STO $508_{11}, 508_{12}, \ldots, 508_{nm}$ will have approximately the same DC resistance). Resistor Rij has a resistance value selected so that the oscillator output currents of the oscillator circuits of nodes $502_{11}, 502_{12}, \ldots, 502_{nm}$ is of approximately the same order as the second input currents coupled to the oscillator circuits of nodes $502_{11}, 502_{12}, \ldots, 502_{nm}$. Persons of ordinary skill in the art will understand that other voltage-to-current converter circuits may be used in the oscillator circuits of cross-point array 500.

In the examples described above, cross-point arrays 400 (FIG. 4) and 500 (FIG. 5) have been used to implement a single layer of an artificial neural network 100b that includes input neurons $x_1, x_2, x_3, \ldots, x_n$, output neurons $y_1, y_2, y_3, \ldots, y_m$, and synapses 102b that connect input neurons $x_1, x_2, x_3, \ldots, x_n$ to output neurons $y_1, y_2, y_3, \ldots, y_m$. In other embodiments, multi-layer artificial neural networks may be implemented by cascading cross-point arrays, so that outputs of a first cross-point array are used as inputs to a second cross-point array, and so on.

One embodiment includes an apparatus that includes an array including m rows and n columns of nodes. Each column of nodes is coupled to one of n first conductive lines, and each row of nodes is coupled to one of m second conductive lines. Each node of the m rows and n columns of nodes includes a spin orbit torque-based spin torque oscillator circuit configured to oscillate at a corresponding intrinsic frequency. The spin orbit torque-based spin torque oscillator circuits are configured to generate m output signals at the m second conductive lines upon application of n input signals to corresponding n first conductive lines. The n input signals correspond to an n-element input vector, and each input signal includes a corresponding input signal frequency. Each of the m output signals include frequency domain components at the input signal frequencies. The magnitudes of the frequency domain components at the input signal frequencies depends on a degree of synchronization between the input signal frequencies and the intrinsic frequencies.

One embodiment includes an apparatus including a cross-point array that includes a plurality of spin orbit torque-based spin torque oscillator circuits configured to store synaptic weights of an artificial neural network, a plurality of first conductive lines coupled to the spin orbit torque-based spin torque oscillator circuits, and a plurality of second conductive lines coupled to the spin orbit torque-based spin torque oscillator circuits. In response to a plurality of input currents coupled to the plurality of first conductive lines, the spin orbit torque-based spin torque oscillator circuits generate output currents at the plurality of second conductive lines representing outputs of the artificial neural network.

One embodiment includes a method including programming each of a first plurality of spin orbit torque-based spin torque oscillator circuits to oscillate at a corresponding intrinsic frequency, generating n input currents corresponding to an n-element input vector, each input current comprising a corresponding input signal frequency, and coupling the n input currents to the first plurality of spin orbit torque-based spin torque oscillator circuits to generate m output currents. Each output current includes frequency domain components at the input signal frequencies, nchronization between the input signal frequencies and the intrinsic frequencies. Magnitudes of the frequency domain components at the input signal frequencies depend on a degree of synchronization between the input signal frequencies and the intrinsic frequencies.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
an array comprising m rows and n columns of nodes, each column of nodes coupled to one of n first conductive lines, each row of nodes coupled to one of m second conductive lines, each node of the m rows and n columns of nodes comprising a spin orbit torque-based spin torque oscillator circuit configured to oscillate at a corresponding intrinsic frequency,
wherein:
the spin orbit torque-based spin torque oscillator circuits are configured to generate m output signals at the m second conductive lines upon application of n input signals to corresponding n first conductive lines, the n input signals corresponding to an n-element input vector, each input signal comprising a corresponding input signal frequency; and
each of the m output signals comprises frequency domain components at the input signal frequencies, and magnitudes of the frequency domain components at the input signal frequencies depend on a degree of synchronization between the input signal frequencies and the intrinsic frequencies.

2. The apparatus of claim 1, wherein the corresponding intrinsic frequency of each spin orbit torque-based spin torque oscillator circuit is programmable.

3. The apparatus of claim 1, wherein each spin orbit torque-based spin torque oscillator circuit is configured to oscillate at corresponding oscillation frequencies based on signals input to the spin orbit torque-based spin torque oscillator circuits.

4. The apparatus of claim 1, wherein the corresponding intrinsic frequency of each spin orbit torque-based spin torque oscillator circuit is based on values of dc input currents applied to the spin orbit torque-based spin torque oscillator circuits.

5. The apparatus of claim 1, wherein the spin orbit torque-based spin torque oscillator circuits are programmed to oscillate at the corresponding intrinsic frequencies based on corresponding weights of an m×n array of weights.

6. The apparatus of claim 5, wherein each of the weights represents an amplitude of dc currents injected into the spin orbit torque-based spin torque oscillator circuits to program the spin orbit torque-based spin torque oscillator circuits to oscillate at the corresponding intrinsic frequencies.

7. The apparatus of claim 1, wherein each spin orbit torque-based spin torque oscillator circuit is coupled to receive one of the n input signals comprising a corresponding input signal frequency, and is configured to oscillate at the corresponding input signal frequency if a difference between the corresponding input signal frequency and the corresponding intrinsic frequency is less than or equal to a predetermined threshold.

8. The apparatus of claim 1, wherein each spin orbit torque-based spin torque oscillator circuit is coupled to receive one of the n input signals comprising a corresponding input signal frequency, and is configured to synchronize its oscillation frequency to the corresponding input signal frequency.

9. The apparatus of claim 1, wherein each spin orbit torque-based spin torque oscillator circuit comprises a spin Hall effect layer comprising one or more of a heavy metal and a topological insulator.

10. The apparatus of claim 1, wherein each spin orbit torque-based spin torque oscillator circuit comprises:
a spin Hall effect layer; and
a magnetic tunnel junction comprising a pinned layer and a free layer that each have a perpendicular magnetization direction, wherein the magnetic tunnel junction comprises a substantially cylindrical shape.

11. The apparatus of claim 1, wherein each spin orbit torque-based spin torque oscillator circuit comprises:
a spin Hall effect layer; and
a magnetic tunnel junction comprising a pinned layer and a free layer that each have an in-plane magnetization direction,
wherein the magnetic tunnel junction comprises a substantially ellipsoidal shape, and the pinned layer and the free layer each have an easy axis perpendicular to a current flow in the spin Hall effect layer.

12. The apparatus of claim 1, wherein each spin orbit torque-based spin torque oscillator circuit comprises:
a spin Hall effect layer; and
a magnetic tunnel junction comprising a pinned layer and a free layer that each have an in-plane magnetization direction,
wherein the magnetic tunnel junction comprises a substantially ellipsoidal shape, and the pinned layer and the free layer each have an easy axis that is at an angle off-perpendicular to a current flow in the spin Hall effect layer.

13. An apparatus comprising:
a cross-point array comprising a plurality of spin orbit torque-based spin torque oscillator circuits configured to store synaptic weights of an artificial neural network;
a plurality of first conductive lines coupled to the spin orbit torque-based spin torque oscillator circuits; and a plurality of second conductive lines coupled to the spin orbit torque-based spin torque oscillator circuits, wherein in response to a plurality of input currents coupled to the plurality of first conductive lines, the spin orbit torque-based spin torque oscillator circuits generate output currents at the plurality of second conductive lines representing outputs of the artificial neural network, and wherein each output current comprises frequency domain components each comprising a magnitude that depends on how closely frequencies of the input currents match oscillation frequencies of the spin orbit torque-based spin torque oscillator circuits.

14. The apparatus of claim 13, wherein each spin orbit torque-based spin torque oscillator circuit comprises a first terminal coupled to one of the first conductive lines, and a second terminal coupled to one of the second conductive lines.

15. An apparatus comprising:
a cross-point array comprising a plurality of spin orbit torque-based spin torque oscillator circuits configured to store synaptic weights of an artificial neural network;
a plurality of first conductive lines coupled to the spin orbit torque-based spin torque oscillator circuits; and
a plurality of second conductive lines coupled to the spin orbit torque-based spin torque oscillator circuits,
wherein in response to a plurality of input currents coupled to the plurality of first conductive lines, the spin orbit torque-based spin torque oscillator circuits generate output currents at the plurality of second conductive lines representing outputs of the artificial neural network; and
wherein each spin orbit torque-based spin torque oscillator circuit comprises a spin Hall effect layer and a magnetic tunnel junction comprising a free layer, wherein the free layer comprises a magnetization direction that oscillates at a programmable frequency.

16. An apparatus comprising:
a cross-point array comprising a plurality of spin orbit torque-based spin torque oscillator circuits configured to store synaptic weights of an artificial neural network;
a plurality of first conductive lines coupled to the spin orbit torque-based spin torque oscillator circuits; and
a plurality of second conductive lines coupled to the spin orbit torque-based spin torque oscillator circuits,
wherein in response to a plurality of input currents coupled to the plurality of first conductive lines, the spin orbit torque-based spin torque oscillator circuits generate output currents at the plurality of second conductive lines representing outputs of the artificial neural network; and wherein each spin orbit torque-based spin torque oscillator circuit is programmed to oscillate at a corresponding intrinsic frequency based on corresponding weights of an m×n array of weights of the artificial neural network.

17. The apparatus of claim 13, wherein each spin orbit torque-based spin torque oscillator circuit comprises a programmable oscillation frequency.

18. An apparatus comprising:
a cross-point array comprising a plurality of spin orbit torque-based spin torque oscillator circuits configured to store synaptic weights of an artificial neural network;
a plurality of first conductive lines coupled to the spin orbit torque-based spin torque oscillator circuits; and
a plurality of second conductive lines coupled to the spin orbit torque-based spin torque oscillator circuits,
wherein in response to a plurality of input currents coupled to the plurality of first conductive lines, the spin orbit torque-based spin torque oscillator circuits generate output currents at the plurality of second conductive lines representing outputs of the artificial neural network; and
wherein each spin orbit torque-based spin torque oscillator circuit further comprises a third terminal coupled to GROUND.

19. A method comprising:
programming each of a first plurality of spin orbit torque-based spin torque oscillator circuits to oscillate at a corresponding intrinsic frequency;
generating n input currents corresponding to an n-element input vector, each input current comprising a corresponding input signal frequency; and
coupling the n input currents to the first plurality of spin orbit torque-based spin torque oscillator circuits to generate m output currents, each output current comprising frequency domain components at the input signal frequencies, and magnitudes of the frequency domain components at the input signal frequencies depend on a degree of synchronization between the input signal frequencies and the intrinsic frequencies.

20. The method of claim 19, further comprising providing them output currents as input currents to a second plurality of spin orbit torque-based spin torque oscillator circuits that are each programmed to oscillate at a corresponding intrinsic frequency.

* * * * *